(12) United States Patent
Nagumo

(10) Patent No.: US 10,812,790 B2
(45) Date of Patent: Oct. 20, 2020

(54) DATA PROCESSING APPARATUS AND DATA PROCESSING METHOD

(71) Applicant: SONY CORPORATION, Tokyo (JP)

(72) Inventor: Takefumi Nagumo, Kanagawa (JP)

(73) Assignee: SONY CORPORATION, Tokyo (JP)

(*) Notice: Subject to any disclaimer, the term of this patent is extended or adjusted under 35 U.S.C. 154(b) by 4 days.

(21) Appl. No.: 16/093,451

(22) PCT Filed: Apr. 5, 2017

(86) PCT No.: PCT/JP2017/014166
§ 371 (c)(1),
(2) Date: Oct. 12, 2018

(87) PCT Pub. No.: WO2017/183448
PCT Pub. Date: Oct. 26, 2017

(65) Prior Publication Data
US 2019/0132586 A1 May 2, 2019

(30) Foreign Application Priority Data
Apr. 19, 2016 (JP) ................. 2016-083836

(51) Int. Cl.
*H04N 19/103* (2014.01)
*H04N 1/413* (2006.01)
(Continued)

(52) U.S. Cl.
CPC ............ *H04N 19/103* (2014.11); *H03M 7/30* (2013.01); *H03M 7/3062* (2013.01);
(Continued)

(58) Field of Classification Search
CPC .... H03M 7/30; H03M 7/3062; H03M 7/3071; H04N 19/103; H04N 19/124;
(Continued)

(56) References Cited

U.S. PATENT DOCUMENTS 6,094,455 A 7/2000 Katta
2012/0288003 A1 11/2012 Do et al.
(Continued)

FOREIGN PATENT DOCUMENTS

JP 07-321666 A 12/1995
JP 10-155152 A 6/1998
(Continued)

OTHER PUBLICATIONS

International Search Report and Written Opinion of PCT Application No. PCT/JP2017/014166, dated Jun. 13, 2017, 11 pages of ISRWO.

*Primary Examiner* — Eileen M Adams
(74) *Attorney, Agent, or Firm* — Chip Law Group

(57) ABSTRACT

The present technology relates to a data processing apparatus, data processing method, and a program which improve a compression ratio. Provided are a first compression part compressing data using compressed sensing and a second compression part compressing observation coefficients coming from the first compression part using a method different from the method used in the first compression part. The first compression part performs random sampling using a sampling matrix optimized for compression by the second compression part. The sampling matrix is designed to minimize the differential value between the observation coefficients. The present technology can be applied to recording/reproducing apparatuses that capture, compress, record, and reproduce image data.

19 Claims, 28 Drawing Sheets

(51) Int. Cl.
- *H04N 1/41* (2006.01)
- *H04N 19/46* (2014.01)
- *H03M 7/30* (2006.01)
- *H04N 19/59* (2014.01)
- *H04N 19/85* (2014.01)
- *H04N 9/804* (2006.01)
- *H04N 19/124* (2014.01)
- *H04N 19/14* (2014.01)
- *H04N 19/176* (2014.01)
- *H04N 5/341* (2011.01)
- *H04N 5/77* (2006.01)

(52) U.S. Cl.
CPC ............ *H03M 7/3071* (2013.01); *H04N 1/41* (2013.01); *H04N 1/413* (2013.01); *H04N 5/341* (2013.01); *H04N 5/77* (2013.01); *H04N 9/8042* (2013.01); *H04N 19/124* (2014.11); *H04N 19/14* (2014.11); *H04N 19/176* (2014.11); *H04N 19/46* (2014.11); *H04N 19/59* (2014.11); *H04N 19/85* (2014.11)

(58) Field of Classification Search
CPC ...... H04N 19/14; H04N 19/176; H04N 19/46; H04N 19/59; H04N 19/85; H04N 1/41; H04N 1/413; H04N 5/341; H04N 5/77; H04N 9/8042

See application file for complete search history.

(56) References Cited

U.S. PATENT DOCUMENTS

2015/0326246 A1* 11/2015 Li ...................... H04L 27/2642
                                                        375/259
2016/0123943 A1*  5/2016 Li ......................... G06N 3/084
                                                         702/31

FOREIGN PATENT DOCUMENTS

| JP | 2002-517851 A | 6/2002 |
| JP | 2013-517681 A | 5/2013 |
| JP | 2015-109595 A | 6/2015 |
| JP | 2015-220687 A | 12/2015 |
| WO | 99/64944 A2 | 12/1999 |

* cited by examiner

FIG. 3
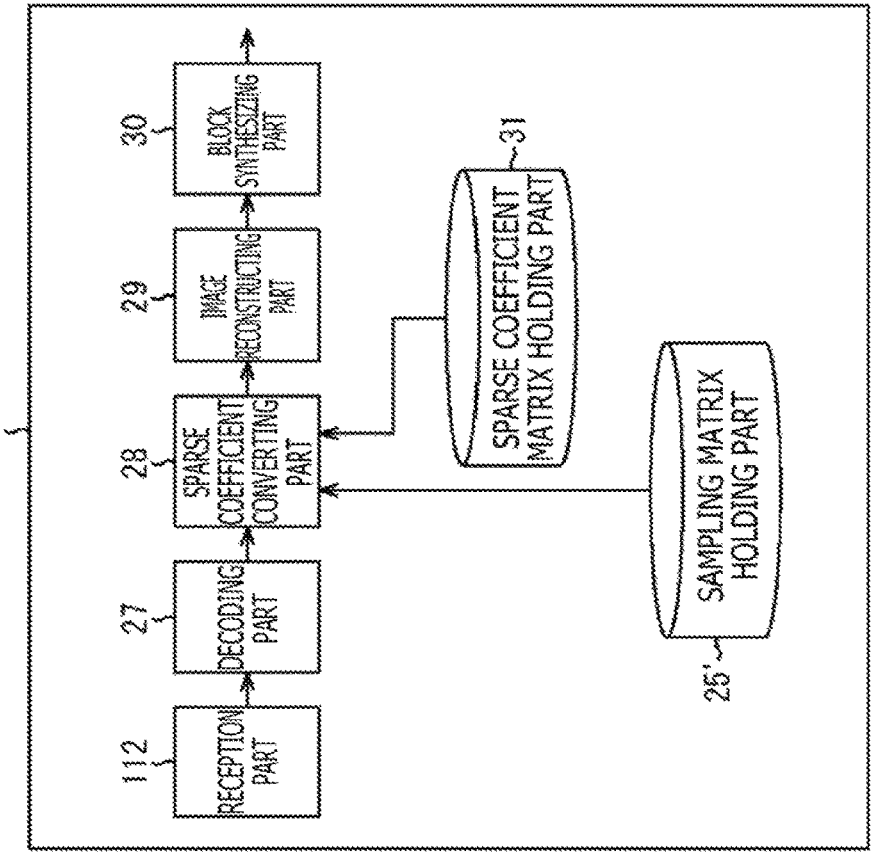
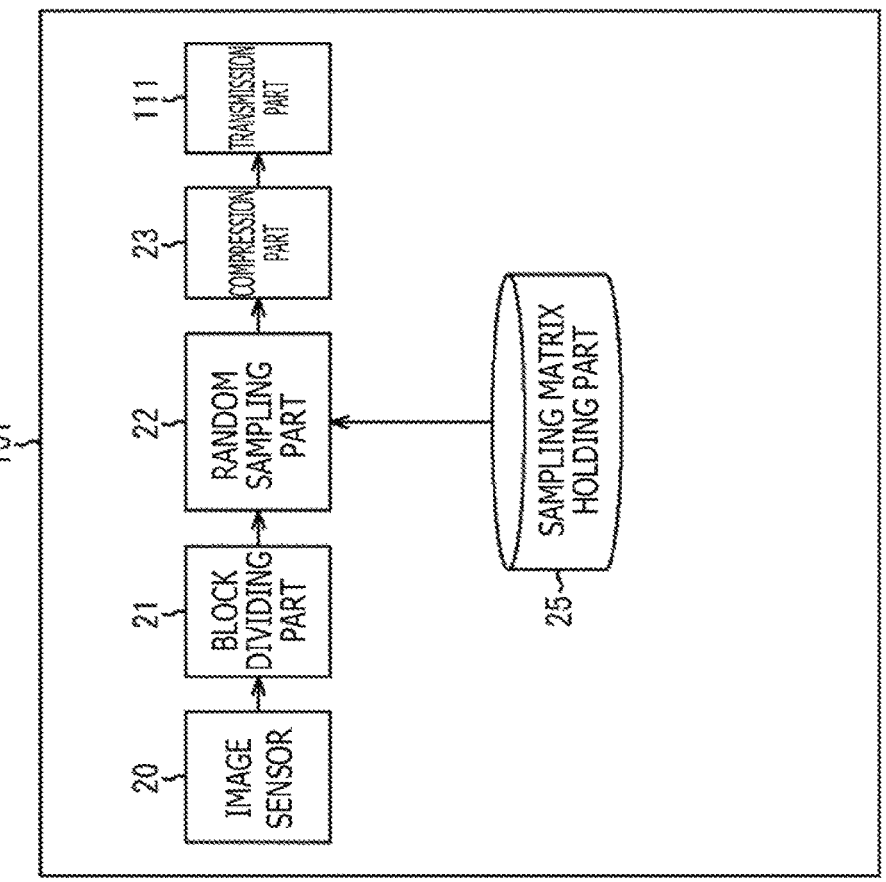

FIG. 9

| 1 | BestCost = Cost(A); // PROVISIONAL COST IS CALCULATED USING CURRENT SAMPLING MATRIX |
| --- | --- |
| 2 | |
| 3 | do{ |
| 4 | for (n=0; n<i; n++) { |
| 5 | for (m=0; m<i; m++) { |
| 6 | Amod IS PREPARED IN WHICH A ELEMENTS Am AND An ARE SWITCHED; |
| 7 | ModCost = Cost(Amod); |
| 8 | |
| 9 | if (ModCost < BestCost ) { |
| 10 | BestCost=ModCost;        //Cost FOR COMPARISON IS UPDATED |
| 11 | BestA = Amod;           //PROVISIONAL OPTIMUM MATRIX IS UPDATED |
| 12 | } |
| 13 | }//for (m=0; m<i; m++) { |
| 14 | |
| 15 | A=BestA; // SAMPLING MATRIX IS UPDATED TO PROVISIONAL OPTIMUM MATRIX |
| 16 | }//for (n=0; n<i; n++) { |
| 17 | } while(IN A CASE WHERE THERE ARE CHANGES COMPARED WITH THE PRECEDING Cost); |

FIG.17

| VARIANCE VALUE | QUANTIZATION VALUE |
|---|---|
| THRESHOLD VALUE T1 OR SMALLER | 1 (NO QUANTIZATION) |
| LARGER THAN THRESHOLD VALUE T1 AND UP TO THRESHOLD VALUE T2 | 2 (LSB 1 bit QUANTIZED) |
| LARGER THAN THRESHOLD VALUE T2 AND UP TO THRESHOLD VALUE T3 | 4 (LSB 2 bit QUANTIZED) |
| LARGER THAN THRESHOLD VALUE T3 AND UP TO THRESHOLD VALUE T4 | 8 (LSB 3 bit QUANTIZED) |
| LARGER THAN THRESHOLD VALUE T4 | 16 (LSB 4 bit QUANTIZED) |

451

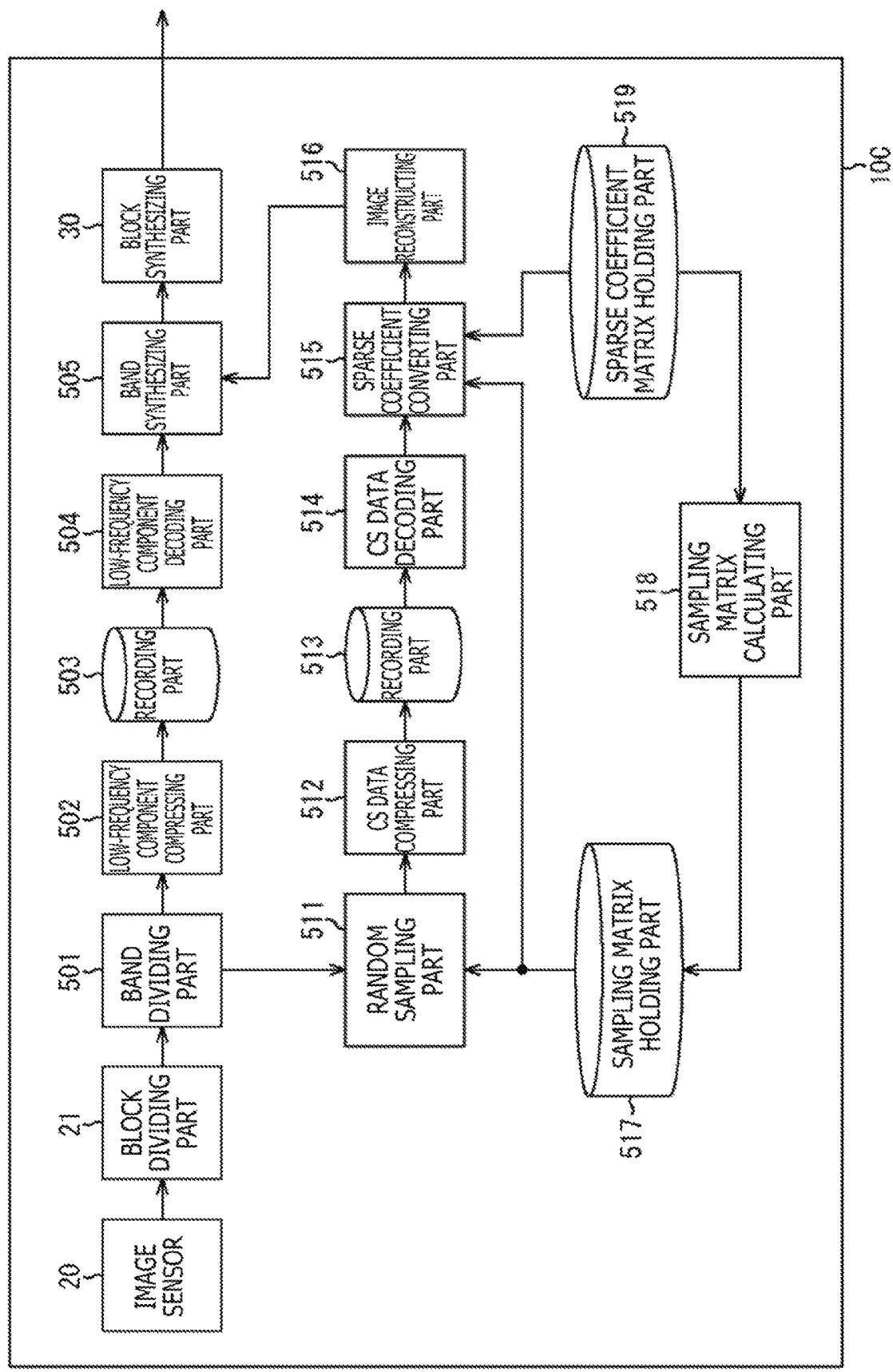

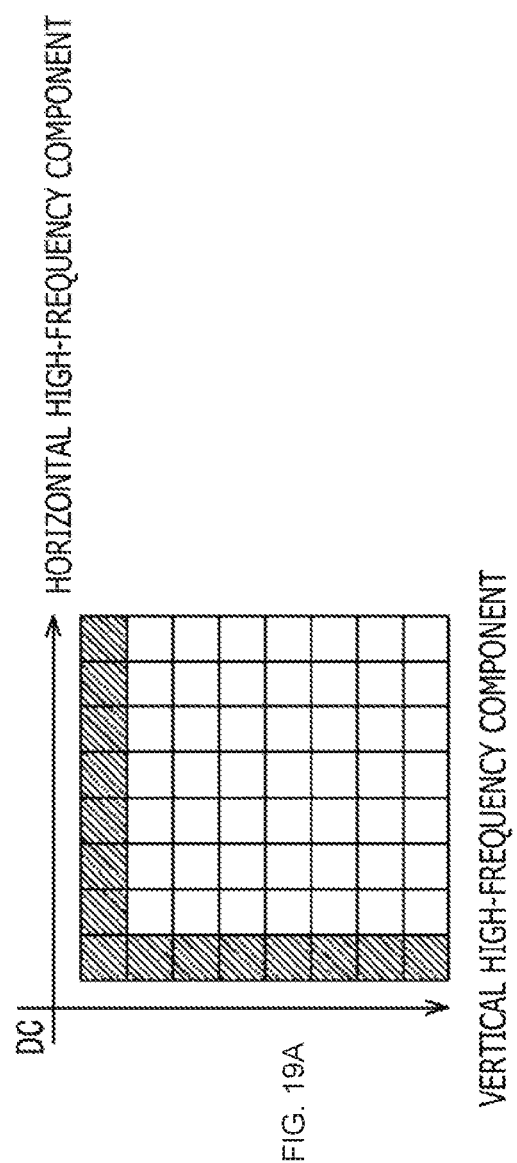
FIG. 19A
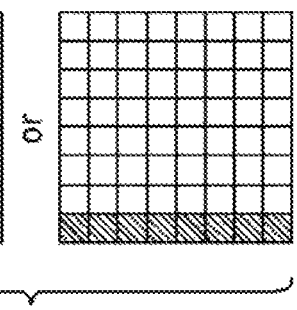
FIG. 19E
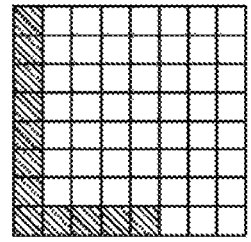
FIG. 19D
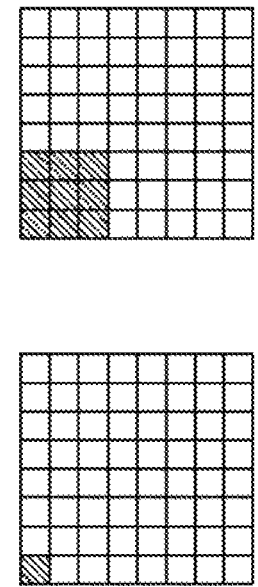
FIG. 19C
FIG. 19B

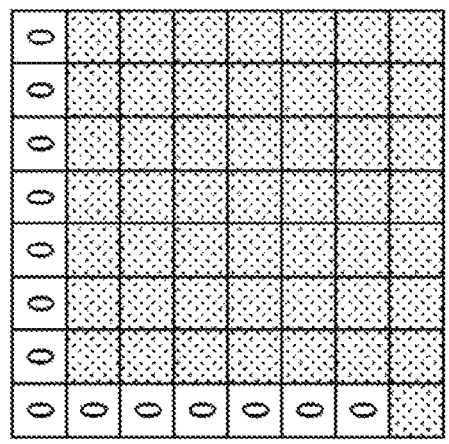
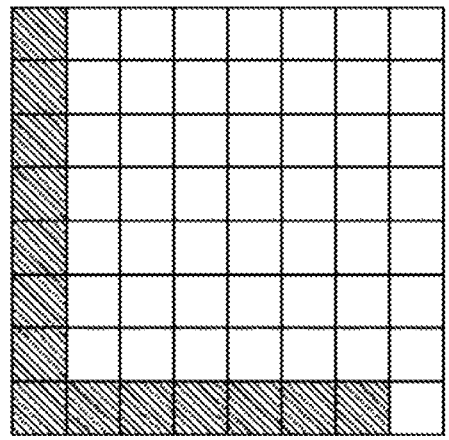
FIG. 22B
FIG. 22A

DATA PROCESSING APPARATUS AND DATA PROCESSING METHOD

CROSS REFERENCE TO RELATED APPLICATIONS

This application is a U.S. National Phase of International Patent Application No. PCT/JP2017/014166 filed on Apr. 5, 2017, which claims priority benefit of Japanese Patent Application No. JP 2016-083836 filed in the Japan Patent Office on Apr. 19, 2016. Each of the above-referenced applications is hereby incorporated herein by reference in its entirety.

TECHNICAL FIELD

The present technology relates to a data processing apparatus, a data processing method, and a program, and more particularly, the technology relates to a data processing apparatus, a data processing method, and a program which is configured to efficiently compress data using compressed sensing, for example.

BACKGROUND ART

A technique known as "compressed sensing" has been developed in recent years. It has been proposed that compressed sensing be applied to, for example, an image restoration in which pixel values (charge signals) of multiple pixels are added at the time of capturing an image to compress an amount of information of the image through use of sparsity of the image (see Non Patent Literature 1, for example).

CITATION LIST

Non Patent Literature

[NPL 1]
J. Ma, "Improved Iterative Curvelet Thresholding for Compressed Sensing and Measurement," IEEE Transactions on Instrumentation and Measurement, vol. 60, no. 1, pp. 126-136, 2011.

SUMMARY

Technical Problems

In one existing technique of compressed sensing, compression is achieved by synthesizing data through random sampling to reduce the number of synthesizing the data. In the case of improving a compression ratio of data, it is required to further reduce the number of synthesizing the data. However, reducing the number of synthesizing the data make it difficult to acquire an appropriate sparse matrix, which may cause difficulty in reconstructing the image appropriately.

Also, even in a case where the image can be reconstructed, there is a possibility that degradation of image quality may become greater due to reduction in the number of reference data.

Also, there is a way of applying data compression to randomly sampled data. However, because the randomly sampled data differs significantly from common image data in its properties, such as low correlation among adjacent pixels, there is a possibility that the randomly sampled data may not be compressed efficiently using existing compression algorithms.

The present technology has been achieved in view of the above circumstances and is to improve a compression ratio.

Solution to Problems

According to one aspect of the present technology, there is provided a data processing apparatus including a first compression part compressing data using compressed sensing, and a second compression part compressing observation coefficients from the first compression part using a compression method different from the method used by the first compression part.

According to another aspect of the present technology, there is provided a data processing method including the steps of compressing data using compressed sensing, and encoding observation coefficients resulting from the compression.

According to a further aspect of the present technology, there is provided a program for causing a computer to perform a process including the steps of compressing data using compressed sensing, and encoding observation coefficients resulting from the compression.

The data processing apparatus, data processing method, and program according to some aspects of the present technology compress data using compressed sensing and encode observation coefficients resulting from the compression.

Incidentally, the data processing apparatus may be either an independent apparatus or an internal block constituting a portion of a single apparatus.

Also, the program may be transmitted via transmission media or recorded on recording media when offered.

Advantageous Effects of Invention

Thus, according to one aspect of the present technology, data compression ratio is improved.

The advantageous effects outlined above are only examples and not limitative of the present disclosure. Further advantages will become apparent from a reading of the present disclosure.

BRIEF DESCRIPTION OF DRAWINGS

FIG. 3 is a schematic diagram illustrating still another configuration of the data processing apparatus.

FIG. 9 is another explanatory diagram explaining how the sampling matrix is sorted.

FIG. 17 is an explanatory diagram explaining a table.

FIG. 18 is a schematic diagram illustrating a configuration of a data processing apparatus of a third embodiment of the present technology.

FIGS. 19A, 19B, 19C, 19D, and 19E are schematic diagrams illustrating examples of divisions into low-frequency and high-frequency components.

FIGS. 22A and 22B are explanatory diagrams explaining the sampling matrix.

DESCRIPTION OF EMBODIMENTS

Modes for implementing the present technology (referred to as embodiments) will be described below. Note that description will be given in the following order:

1. First Embodiment
2. Configuration of Data Processing Apparatus
3. Operation of Sampling Matrix Calculating Part
4. Configuration and Operation of Compression Part
5. Sorting of Sampling Matrix
6. Another Configuration of Compression Part
7. Generation of Predictive Value
8. Configuration and Operation of Decoding Part
9. Second Embodiment
10. Third Embodiment
11. Fourth Embodiment
12. Recording Media

First Embodiment

<Configuration of Data Processing Apparatus>

The present technology is applicable to apparatuses compressing data. Explained below is a case where the technology is applied to an apparatus recording and reproducing images captured by an image sensor to compress data at the timing of recording. The technology to be described below may also be applied to apparatuses acquiring audio and other data besides the image data to be compressed.

Figure 1:
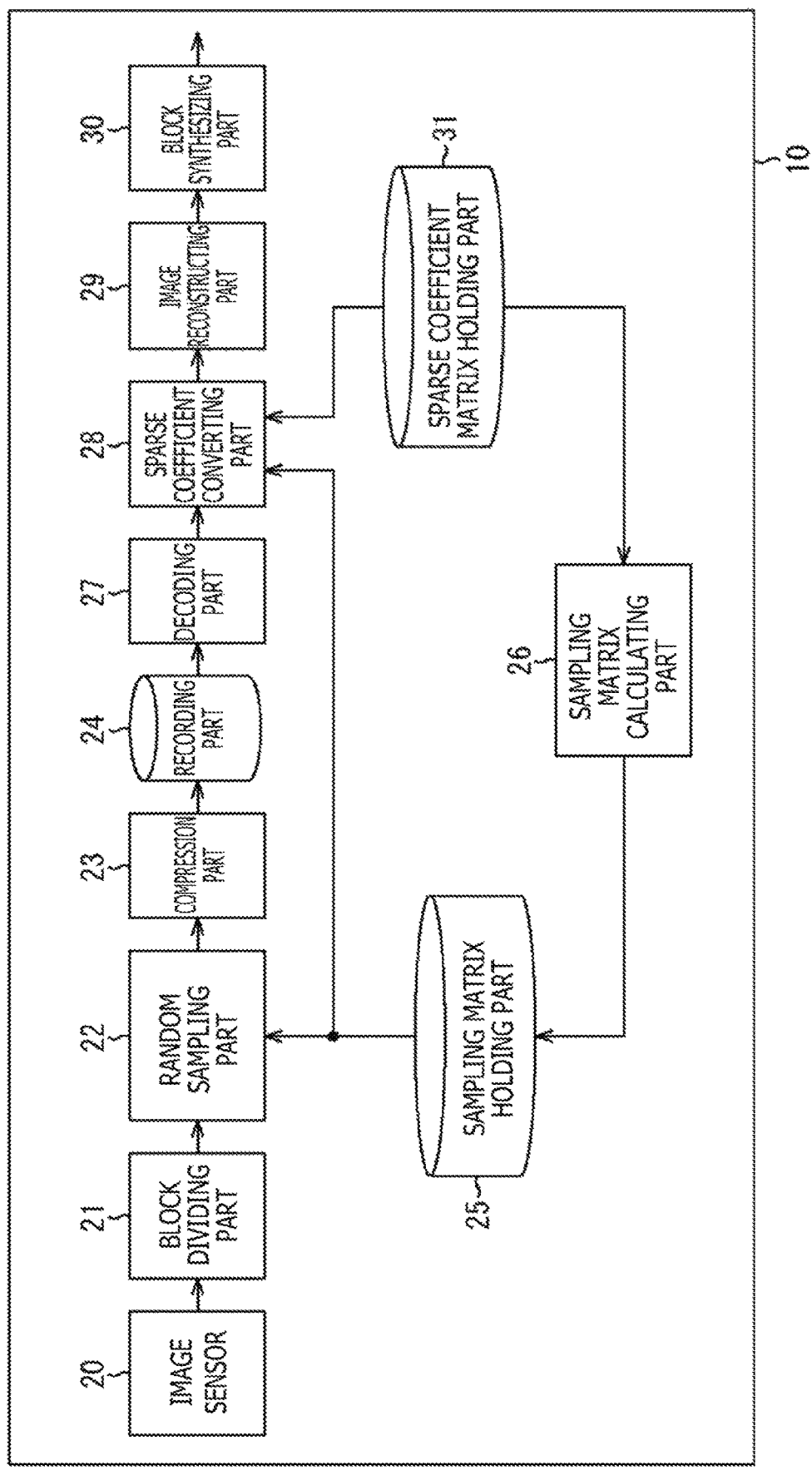
FIG. 1 is a schematic diagram illustrating a configuration of a data processing apparatus of one embodiment to which the present technology is applied.

FIG. 1 is a schematic diagram illustrating a configuration of a data processing apparatus of one embodiment to which the present technology is applied. A data processing apparatus 10 illustrated in FIG. 1 includes an image sensor 20, a block dividing part 21, a random sampling part 22, a compression part 23, a recording part 24, a sampling matrix holding part 25, a sampling matrix calculating part 26, a decoding part 27, a sparse coefficient converting part 28, an image reconstructing part 29, a block synthesizing part 30, and a sparse coefficient matrix holding part 31.

In the data processing apparatus 10, image data of an image captured by the image sensor 20 is compressed when recorded in the recording part 24, as will be discussed below in detail. A technique known as compressed sensing (compressive sensing) is used at the time of compressing the data. According to the compressed sensing technique, the data is compressed using a matrix called the sampling matrix (i.e., data is calculated using the matrix). The sampling matrix calculating part 26 performs a process of optimizing the sampling matrix for compression such that the compression part 23 easily compress the matrix.

The sampling matrix is held in the sampling matrix holding part 25. That is, the sampling matrix calculating part 26 generates (optimizes) the sampling matrix held in the sampling matrix holding part 25. The time to generate the sampling matrix is called the time of learning in this context.

The sampling matrix held in the sampling matrix holding part 25 is used basically without being updated. Thus, the sampling matrix calculating part 26 is needed at the timing of generating the sampling matrix, i.e., at the time of learning but may be omitted from the data processing apparatus 10 after the learning.

Figure 2:
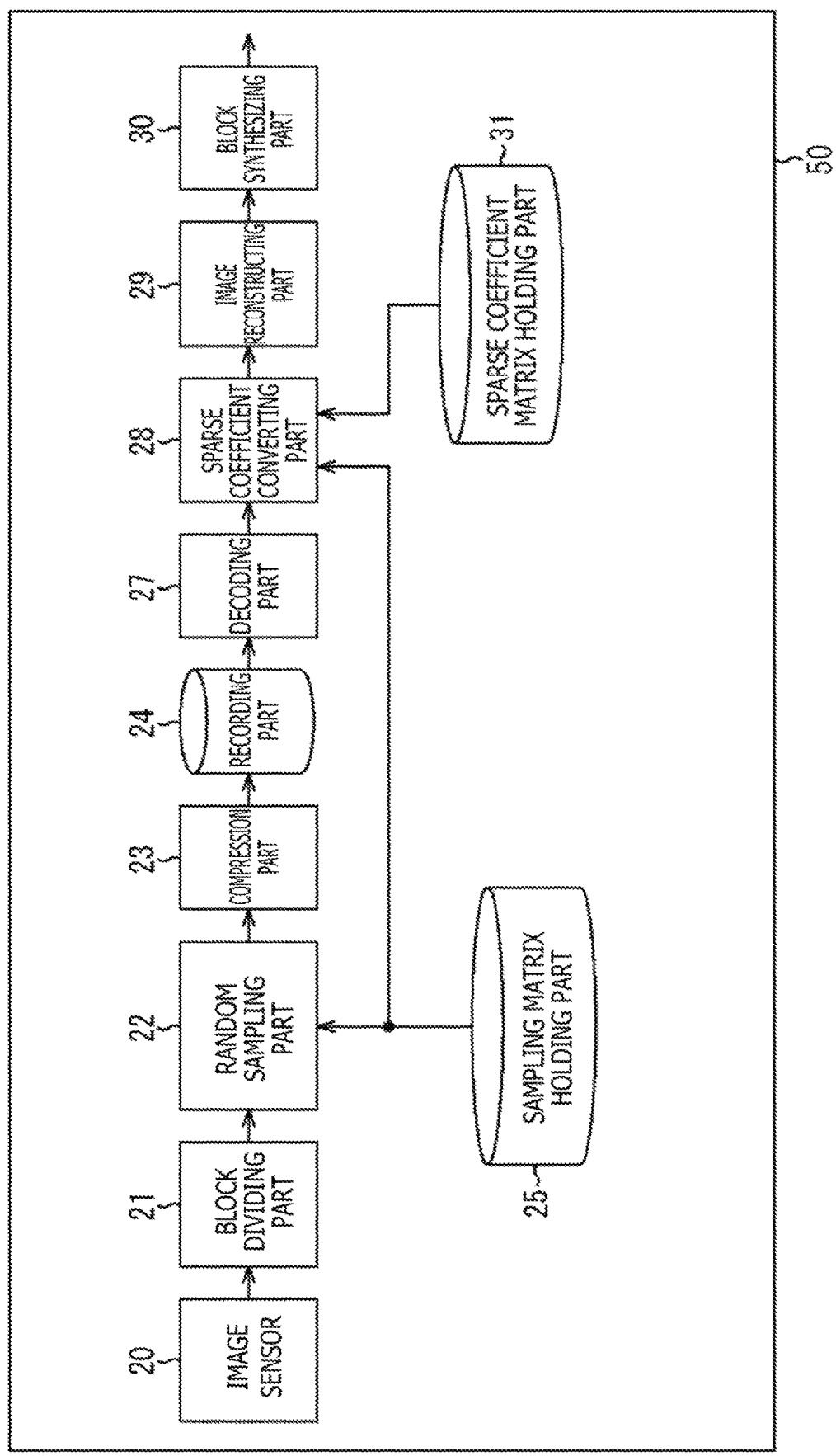
FIG. 2 is a schematic diagram illustrating another configuration of the data processing apparatus.

That is, the data processing apparatus 10 after the learning may be configured as illustrated in FIG. 2. Here, the data processing apparatus 10 after the learning is described as a data processing apparatus 50.

The data processing apparatus 50 has the same configuration to the data processing apparatus 10 illustrated in FIG. 1 except that the sampling matrix calculating part 26 is removed from the data processing apparatus 10 illustrated in FIG. 1.

Moreover, the data processing apparatus 10 (data processing apparatus 50) has a function of recording the image captured by the image sensor 20 in the recording part 24 and further decoding (reproducing) the recorded image data. That is, the data processing apparatus 10 (data processing apparatus 50) has a configuration as a recording/reproducing apparatus which records and reproduces data.

However, application of the present technology is not limited to the recording/reproducing apparatus. The present technology is also applicable to a case where a recording apparatus and a reproduction apparatus are configured separately. FIG. 3 illustrates a configuration in a case where the data processing apparatus 50 is divided into a recording apparatus and a reproduction apparatus.

A data processing apparatus 100 is constituted by a recording apparatus 101 and a reproduction apparatus 102. Basically, the data processing apparatus 100 includes the same configuration as that of the data processing apparatus 50 after the learning illustrated in FIG. 2.

The recording apparatus 101 in the data processing apparatus 100 includes the image sensor 20, the block dividing part 21, the random sampling part 22, the compression part 23, the sampling matrix holding part 25, and a transmission part 111.

The reproduction apparatus 102 includes a sampling matrix holding part 25', the decoding part 27, the sparse coefficient converting part 28, the image reconstructing part 29, the block synthesizing part 30, the sparse coefficient matrix holding part 31, and a reception part 112.

In the recording apparatus 101, the compression part 23 compresses the image data of the image captured by the image sensor 20. The transmission part 111 then transmits the compressed image data to a side of the reproduction apparatus 102. The reproduction apparatus 102 decodes (reproduces) the image data transmitted from a side of the recording apparatus 101. The image data may be transmitted and received in either wired or wireless communication, or in a combination of wired and wireless communication.

The sampling matrix holding part 25 included in the recording apparatus 101 and the sampling matrix holding part 25' included in the reproduction apparatus 102 hold the same sampling matrix. Also, the sampling matrix being held has been learned and optimized by the sampling matrix calculating part 26 for data compression.

Because this technology improves efficiency of data compression, it is possible to reduce an amount of data to be recorded in the recording part 24 in the data processing apparatus 50 illustrated in FIG. 2, for example. This makes it possible to make effective use of a capacity of the recording part 24. Also, an amount of data transmitted or received by the data processing part 100 illustrated in FIG. 3 can be reduced by the present technology. This enhances efficiency of data communication.

In the following, description will be given using, as an example, the configuration of the data processing apparatus 10 illustrated in FIG. 1. First, operation of the data processing part 10 will be described.

The image sensor 20 in the data processing apparatus 10 includes charge-coupled device (CCD) sensors or complementary MOS (CMOS) sensors. The image sensor 20 captures an image of a target object and generates the image data of the captured image.

The block dividing part 21 divides the image captured by the image sensor 20 into units of a processing block and supplies the divided image to the random sampling part 22 in units of a processing block. The units of a processing block may be set arbitrarily by a designer at the time of designing. Note that, in a case where the entire screen is regarded as a single block, it is also possible to have a configuration in which the block dividing part 21 is omitted.

In this case, description will be given using, as an example, a case where the image is divided into blocks of n×n pixels each. Also in the following description, the n×n pixels may be denoted by the symbol x representing an $n^2$-dimensional vector.

The random sampling part 22 is supplied with the image data in units of a processing block from the block dividing part 21 and with the sampling matrix from the sampling matrix holding part 25. Given the x vector from the block dividing part 21, the random sampling part 22 generates a coefficient y randomly sampled by the following mathematical expression (1) using a predetermined sampling matrix:

[Math. 1]

$$y = A \cdot x \tag{1}$$

In the expression (1) above, A stands for the sampling matrix, which is an $n^2 \times i$ matrix. $n^2$ corresponds to the number of the above-mentioned n×n pixels in each unit processing block. For example, in a case where there are 4×4 pixels in each unit processing block with i denoting 8, carrying out calculations based on the mathematical expression (1) above compresses $n^2$-dimensions=16-dimensions into i-dimensions=8-dimensions.

That is, performing calculations based on the expression (1) above compresses $n^2$-dimensions into i-dimensions. i may be set arbitrarily by the designer in consideration of an amount of reduced data and of image quality and usually, set to $n^2 > i$. Also, the sampling matrix is determined also by taking into account a sparse coefficient matrix held in the sparse coefficient holding part 31.

The sampling matrix needs to meet the restricted isometry property (RIP) condition and to satisfy the requirement that the row vector of a matrix A in the sampling matrix and the column vector of a matrix φ in the sparse coefficient matrix are incoherent. The RIP condition is expressed by the mathematical expression (2) below. In the expression (2), Zs stands for any s-sparse vector with respect to any s in the same dimension as the x vector.

[Math. 2]

$$1 - \varepsilon_s \leq \frac{\|A\phi z_s\|_2^2}{\|z_s\|_2^2} \leq 1 + \varepsilon_s \tag{2}$$

Note that compressed sensing (compressive sensing) using the sampling matrix is discussed in the following literature and may be also applied to the present technology:

"R. Baraniuk, "Compressed sensing [lecture notes], "IEEE Signal Processing Magazine, vol. 24, pp. 118-121, July 2007."

The sampling matrix is generated by the sampling matrix calculating part 26. At the time of its generation, the sampling matrix is optimized for compression by the compression part 23. Processes of optimization and of compression using the optimized sampling matrix, to be described later, are briefly described below.

The sparse coefficient matrix to be taken into account at the time of generating the sampling matrix will be described here. The sparse coefficient matrix is a $j \times n^2$ matrix. In general, j is set to $j \gg n^2$. The sparse coefficient matrix is also used to reconstruct images from coefficient data.

In the data processing apparatus 10 illustrated in FIG. 1, the sparse coefficient matrix is held in the sparse coefficient matrix holding part 31. The sparse coefficient matrix held in the sparse coefficient matrix holding part 31 is used when the image is reconstructed through the processes in the sparse coefficient converting part 28 and the image reconstructing part 29 from the coefficient data stored in the recoding part 24 and decoded by the decoding part 27 (the coefficient data corresponds to y in the expression (1) above).

The sparse coefficient matrix is obtained by calculating the major components of an image of n×n pixels through learning etc. to be converted into a matrix form. The major components include j pieces of data satisfying a relation $j \gg n^2$. Each of the major components may be called a sparse base. This sparse coefficient matrix may be generated through techniques such as the K-SVD method.

The sampling matrix holding part 25 holds the sampling matrix generated by the above-mentioned method and optimized for compression to be described below. The random sampling part 22 randomly samples the image data using the sampling matrix held in the sampling matrix holding part 25.

The dimensions of the data having been sampled become the i-dimensions as mentioned above. The sampled data becomes smaller in size than the original number of pixels (n×n pixels in the $n^2$-dimensions), which means that the data is compressed. Also according to the present technology, the data is further compressed through a further compression process by the compression part 23 in the latter stage.

A configuration and a process of the compression part 23 will be described later, and operation of the data processing apparatus 10 will be described first. The data compressed by the compression part 23 (coefficient data y) is recorded in the recording part 24. The data recorded in the recording part 24 is read out and decoded by the decoding part 27. The decoding part 27 decodes the data by using a decoding method corresponding to a compression (encoding) method used by the compression part 23.

The sparse coefficient converting part 28 generates a sparse coefficient z using the sparse coefficient matrix held in the sparse coefficient matrix holding part 31 and the sampling matrix held in the sampling matrix holding part 25. Specifically, when it is assumed that φ stands for the sparse coefficient matrix, A for the sampling matrix, and y for the data input to the sparse coefficient converting part 28, the sparse coefficient z is calculated on the basis of the following mathematical expression (3):

[Math. 3]

$$z = \arg\min \|z\|_0$$

subject to $A\phi z = y$ (3)

The mathematical expression (3) above is used to calculate the sparse coefficients z in such a manner that Aφz=y is satisfied and that the L0 norm is minimized. In practice, however, since it is difficult to obtain an exact solution using the expression (3) above, the mathematical expression (4) below, for example, may be used to solve a relaxation problem.

[Math. 4]

$$\min_{z} \|y - A\phi z\|_2^2 + \lambda \|z\|_1, \lambda > 0 \quad (4)$$

Alternatively, the sparse coefficients z may be acquired in algorithms such as Matching Pursuit or Basic Pursuit. Regardless of the method in use, the sparse coefficient converting part 28 performs the process of converting the randomly sampled data y into the sparse coefficients z and supplying the sparse coefficients z to the image reconstructing part 29.

The image reconstructing part 29 reconstructs the image data on the basis of the following mathematical expression (5):

[Math. 5]

$$x = \phi \cdot z \quad (5)$$

A reconstructed image x is obtained by a product of the sparse coefficient matrix φ and the sparse coefficients z. The reconstructed image x is equivalent to the image output from the block dividing part 21. Thus, the block synthesizing part 30 adds up the images corresponding to each of the blocks to reconstruct a single image.

In this manner, the image data is compressed, recorded, and reconstructed. Note that the technique of compressed sensing method described here is only an example, and application of the present technique is limited to this method.

<Operation of Sampling Matrix Calculating Part>

Figure 4:
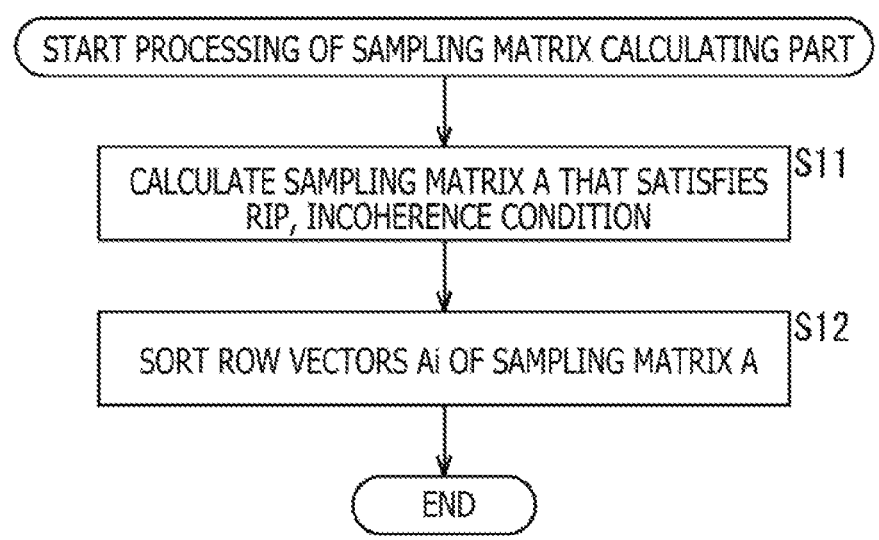
FIG. 4 is a flowchart explaining an operation of a sampling matrix calculating part.

Next, the operation of the sampling matrix calculating part 26 will be described with reference to the flowchart illustrated in FIG. 4.

In step S11, a sampling matrix A that meets the RIP condition and satisfies the incoherence requirement is calculated. As described above, the sampling matrix A is calculated in such a manner as to meet the RIP condition and to satisfy the incoherence requirement that the row vectors of the sampling matrix A and the column vectors of the sparse coefficient matrix φ be incoherent.

Also, in order to meet the above conditions, the sampling matrix A may be generated through Gaussian distribution. In a case where the number of pixels of each block is assumed to be $n^2$, a given row vector Ai of the sampling matrix A often has a mean value of 0 and a variance of $1/n^2$. In such a case, the inner product between any two row vectors <Ai, Aj> is either 0 or a sufficiently small value, and the correlation between the row vectors is very low.

With no correlation between any two row vectors, the correlation between the observation coefficients y of compressed sensing and a given vector x is low. However, in a case where the image data from the image sensor 20 (FIG. 1) is compressed by compressed sensing, there presumably is a high correlation in a spatial direction. By taking advantage of the fact that there is a high correlation in the spatial direction of the image data (image), it is configured such that the sampling matrix A capable of generating the observation coefficients y of compressed sensing suitable for compression is generated.

That is, the sampling matrix calculating part 26 in step S11 calculates the sampling matrix A. The calculation may be performed using existing techniques. With the sampling matrix A thus generated, the row vector Ai of the sampling matrix A is sorted (rearranged) in step S12.

Sorting the row vector Ai of the sampling matrix A generates a sampling matrix A capable of generating the observation coefficients y of compressed sensing optimized for compression by the compression part 23 (FIG. 1).

In this manner, in the embodiment to which the present technology is applied, the compression part 23 further compresses the observation coefficients y resulting from compressed sensing. In order to enhance the efficiency of compression at this time, the sampling matrix A, once generated, is converted into a sampling matrix A such that the compression efficiency in the compression part 23 is enhanced (i.e., the sampling matrix A is optimized for compression). The process of the conversion is carried out by the sampling matrix calculating part 26.

Also, the sampling matrix A converted by the sampling matrix calculating part 26 is held in the sampling matrix holding part 25 to be used in the random sampling part 22 at the time of compressed sensing.

The sampling matrix held in the sampling matrix holding part 25 is used in the sparse coefficient converting part 28 to generate the sparse coefficient z.

<Configuration and Operation of Compression Part>

The configuration and the operation of the compression part 23 are first described herein in order to explain the sampling matrix A capable of generating the observation coefficients y of compressed sensing optimized for compression by the compression part 23 (FIG. 1).

Figure 5:
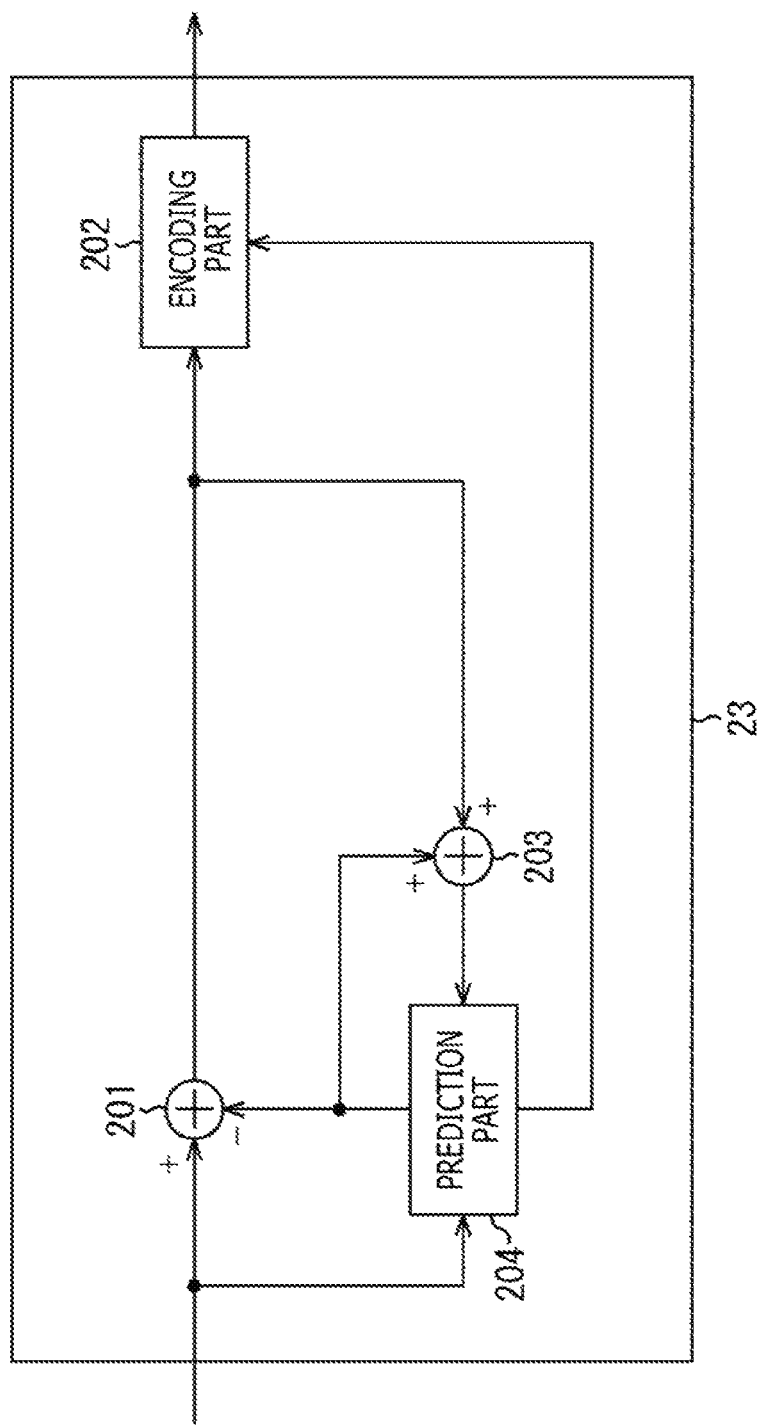
FIG. 5 is an explanatory diagram explaining a configuration of a compression part.

FIG. 5 illustrates a configuration of the compression part 23. The compression part 23 includes a subtraction part 201, an encoding part 202, an addition part 203, and a prediction part 204.

The subtraction part 201 subtracts a predictive value supplied by the prediction part 204 from the observation coefficients y supplied by the random sampling part 22. The subtraction part 201 outputs the result of subtraction (called a differential value hereunder) to the encoding part 202.

The encoding part 202 encodes the differential value from the subtraction part 202 using a predetermined encoding method such as Huffman coding. The differential value encoded by the encoding part 202 is supplied to the recording part 24 (FIG. 1) for recording therein. Also, the differential value encoded by the encoding part 202 is supplied also to the addition part 203.

The addition part 203 is also supplied with the predictive value supplied from the prediction part 204. The configuration and the operation of the prediction part 204 will be described later. The predictive value, to be also described later in detail, may be the observation coefficient y that immediately precedes the observation coefficient y input to the subtraction part 201, for example. A description will be continued assuming that the predictive value is the observation coefficient y (called the observation coefficient $y_{t-1}$) that immediately precedes the observation coefficient y (called the observation coefficient $y_t$) input to the subtraction part 201.

In this manner, the compression part 23 compresses the observation coefficients y by encoding the differential value between each observation coefficient y calculated by the subtraction part 201 and the predictive value. In a case where the observation coefficient y (observation coefficient $y_{t-1}$) that immediately precedes the observation coefficient y (observation coefficient $y_t$) input to the subtraction part 201 is, as the predictive value, input to the subtraction part 201, the subtraction part 201 outputs the differential value obtained by subtracting the observation coefficient $y_{t-1}$ from the observation coefficient $y_t$ (the difference may be called the differential value $(y_t-y_{t-1})$ hereunder where appropriate). The differential value $(y_t-y_{t-1})$ is compressed when encoded by the encoding part 202.

Because the compression is accomplished in this manner, as the differential value $(y_t-y_{t-1})$ gets smaller, it is possible to increase the compression ratio. The observation coefficients y are input successively to the compression part 23 (i.e., to the subtraction part 201 therein). Thus, as the differential value between the successively input observation coefficients y gets smaller, the resulting differential value $(y_t-y_{t-1})$ gets smaller. This can enhance the compression ratio.

In this manner, the sampling matrix A that minimizes the differential value between the successive observation coefficients y is turned into the sampling matrix A capable of generating the observation coefficients y of compressed sensing optimized for compression by the compression part 23.

The sampling matrix calculating part 26 generates the sampling matrix A conducive to minimizing the differential value between the successive observation coefficients y. A further explanation of the process performed in the sampling matrix calculating part 26 will be added herein again.

<Sorting of Sampling Matrix>

Figure 6:
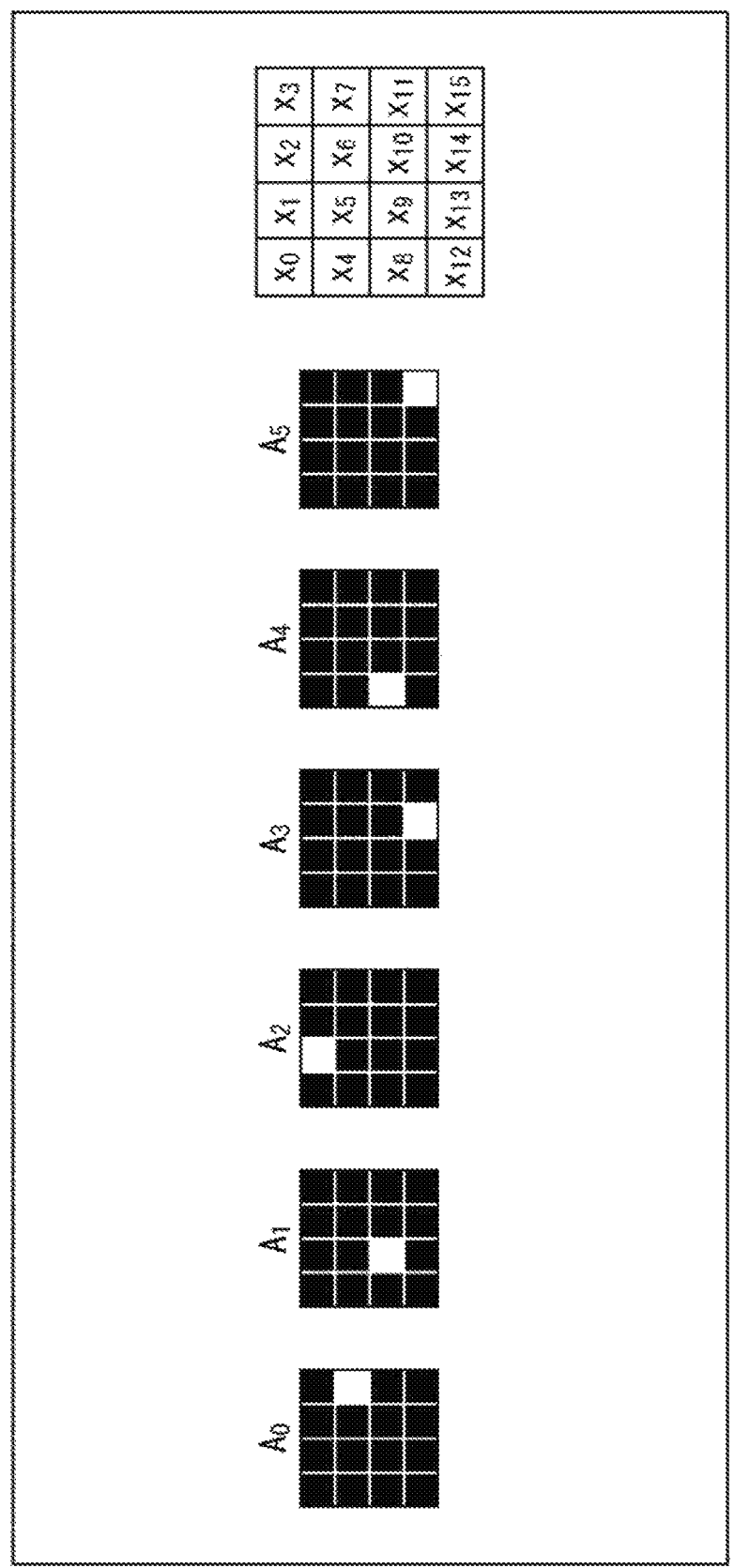
FIG. 6 is an explanatory diagram explaining a sampling matrix.
Figure 7:
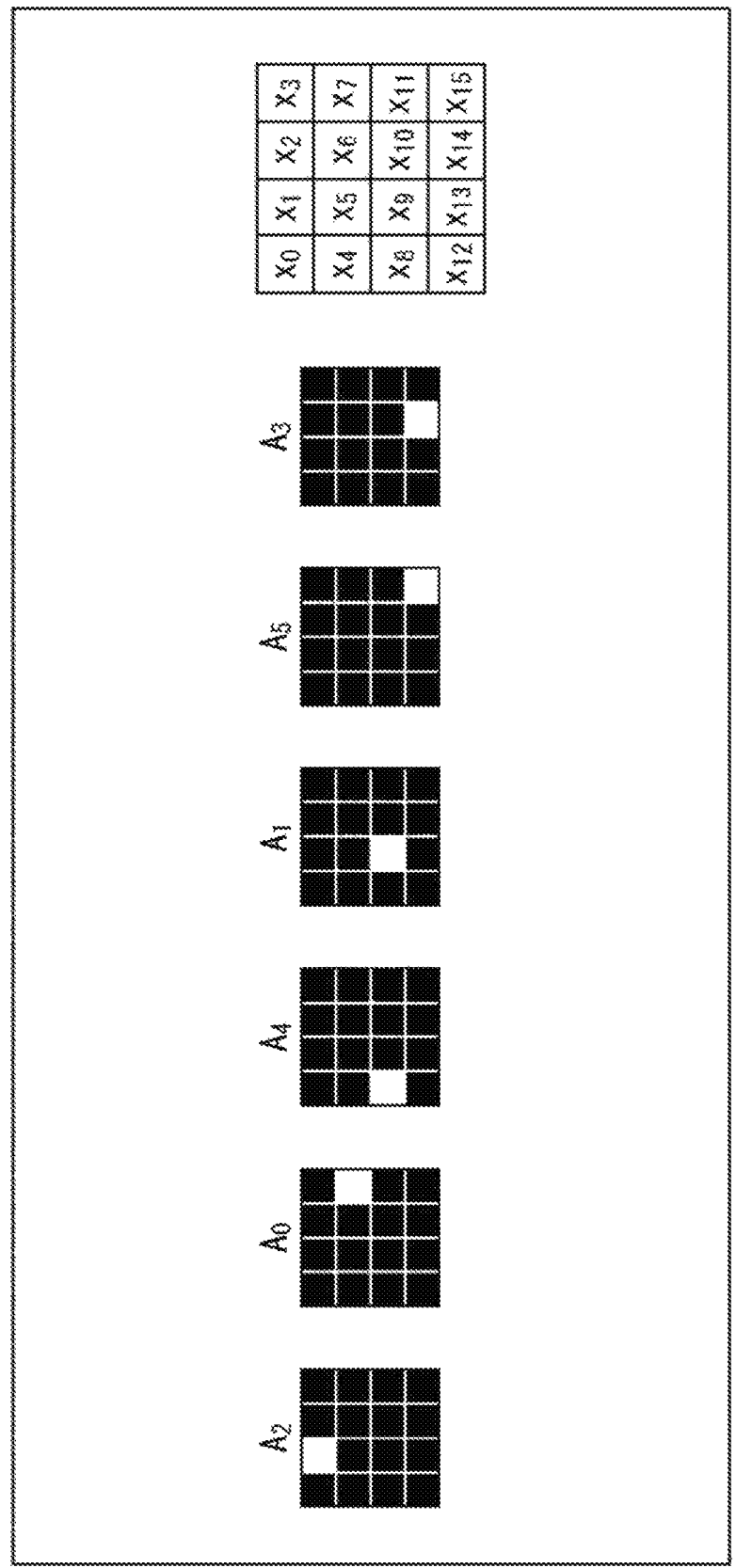
FIG. 7 is another explanatory diagram explaining the sampling matrix.

FIG. 6 illustrates a typical sampling matrix A generated in step S11, and FIG. 7 illustrates another typical sampling matrix A obtained by sorting the generated sampling matrix A in step S12. Also, FIGS. 6 and 7 illustrate the row vectors constituting the sampling matrix A in a schematic two-dimensional notation manner.

The sampling matrix A to be described with reference to FIGS. 6 and 7 is a typical sampling matrix A applicable in a case where random sampling is carried out in units of a block of 4×4 pixels. Reference characters A0 to A5 each indicate the row vector making up the sampling matrix A, i.e., a 16(=4×4)-dimensional row vector.

Also, for example, as illustrated on the right side of FIG. 6, the positions of 4×4 pixels in one block are identified, from top left to bottom right, as x0, x1, x2, x3, x4, x5, x6, x7, x8, x9, x10, x11, x12, x13, x14, and x15.

Also, for example, each rectangle in each block, indicates the position of a pixel in the block. Each rectangle represents the value to be multiplied by the pixel value in the corresponding position. A description will be continued assuming that the rectangles filled with black stand for 0 each and that the rectangles filled with white stand for 1 each. The value 0 stands for a pixel not to be sampled, and the value 1 for a pixel to be sampled. In the matrix A0, for example, the position corresponding to the pixel x7 represents "1" and the positions of the other pixels represent "0" each.

The row vectors A0 to A5 may be expressed by the following matrices:
A0=[0000000100000000]
A1=[0000000001000000]
A2=[0100000000000000]
A3=[0000000000000010]
A4=[0000000010000000]
A5=[0000000000000001]

As illustrated in FIG. 6, the sampling matrix A includes the row vectors A0 to A5. The sampling matrix A is defined by the following mathematical expression (6):

[Math. 6]

$$A = \begin{bmatrix} A_0 \\ A_1 \\ A_2 \\ A_3 \\ A_4 \\ A_5 \end{bmatrix} \quad (6)$$

As described above, the sampling matrix A (i.e., row vectors A0 to A5 included in the sampling matrix A) is designed using a Gaussian distribution random number, so that most of the elements of the matrix are values close to 0. Note that, although a description will be given herein using an example in which the elements of a row vector are either 0 or 1 each, there may also be included elements having other values between the minimum value of 0 and the maximum value of 1.

When the random sampling part 22 performs random sampling using the sampling matrix A defined by the expression (6) above, the matrix given below is obtained as the observation coefficients y. If the observation coefficients y is represented by the pixel values x indicated in the rightmost table in FIG. 6, the matrix is given as follows:

y=[x7 x9 x1 x14 x8 x15]

Suppose that the sampling matrix calculating part 26 performs only the process of step S11 (FIG. 4) to generate the sampling matrix A illustrated in FIG. 6 and that the generated sampling matrix A is held in the sampling matrix holding part 25 before being used in the random sampling part 22 for random sampling. In that case, the random sampling part 22 successively inputs the above-mentioned observation coefficients y to the compression part 23 (FIG. 1).

Suppose now, for example, that an observation coefficient y of "x1" is first input as the observation coefficient $y_{t-1}$ followed by the input of an observation coefficient y of "x14" as the observation coefficient $y_t$. The compression part 23 calculates "x14−x1" to give the differential value of $(y_t-y_{t-1})$ and encodes the resulting value. Here, a reference to the rightmost table in FIG. 6 reveals that the position of the pixel value x1 is spaced apart from that of the pixel x14.

As described above, there presumably exists a high correlation in the spatial direction in the image. It may thus be said that positions close to each other in the spatial direction in the image, having high correlation, tend to translate into small differential values when such values are calculated between the close positions. It may otherwise be said that positions separate from each other in the spatial direction, having low correlation, tend to translate into large differential values calculated between these positions.

It has been described above that, in order to enhance the compression ratio in the compression part 23, the differential value between the observation coefficients y need only be smaller. In view of this, when it is configured to calculate the differential values between the observation coefficients y between close positions in the spatial direction in the image, the compression ratio in the compression part 23 can be enhanced. For this reason, the sampling matrix calculating part 26 generates the sampling matrix in such a manner that the observation coefficients y between close positions in the spatial direction in the image are successively output.

Specifically, the generated sampling matrix A illustrated in FIG. 6 is converted into a sampling matrix A illustrated in FIG. 7. In the sampling matrix A' in FIG. 7 (the converted matrix is indicated by the primed symbol A' for distinction from the unconverted sampling matrix A), the row vectors included in the sampling matrix A' are sorted to be A2, A0, A4, A1, A5, and A3, in this order. The sampling matrix A' is defined by the following mathematical expression:

[Math. 7]

$$A' = \begin{bmatrix} A_2 \\ A_0 \\ A_4 \\ A_1 \\ A_5 \\ A_3 \end{bmatrix} \quad (7)$$

When the random sampling part 22 performs random sampling using the sampling matrix A' defined by the expression (7) above, a matrix given below is obtained as the observation coefficients y. Here, the observation coefficients y are expressed using the pixel values x indicated in the rightmost table in FIG. 7.

y=[x1 x7 x8 x9 x15 x14]

According to the sampling matrix A illustrated in FIG. 6, as described above, the compression part 23 calculates the differential value as "x14−x1." In contrast, according to the sampling matrix A' in FIG. 7, the compression part 23 obtains the differential value between "x14" sampled from the row vector A3 and "X15" sampled from the row vector A5, thus calculating "x15−x14" as the differential value.

The pixel values x14 and x15 are those of pixels adjacent to each other. These pixels are close to each other in the spatial direction. Accordingly, there is a high possibility that the differential value between these pixels is small. Thus, the sampling matrix calculating part 26 changes (sorts) the sampling matrix A (i.e., its row vectors), once generated, in such a manner that the pixels close to each other in the spatial direction become the pixels adjacent to each other.

Figure 8D:
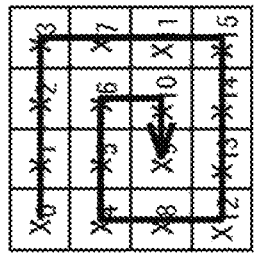
FIGS. 8A, 8B, 8C, and 8D are explanatory diagrams explaining how the sampling matrix is sorted.
Figure 8C:
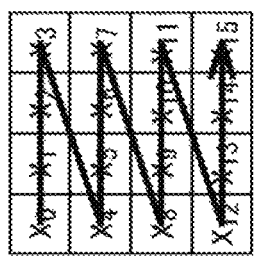
Figure 8B:
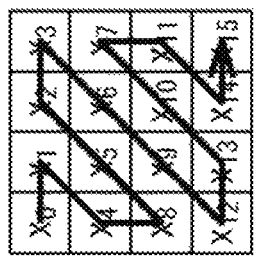
Figure 8A:
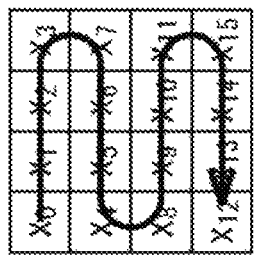

Given below is an example in which the conversion of the sampling matrix A in FIG. 6 into the sampling matrix A' in FIG. 7 involves sorting the row vectors such that the maximum values therein are ordered as illustrated in FIG. 8A.

When sorted as illustrated in FIG. 8A, the row vectors have their maximum values (1 in the example of FIG. 6) manifested in the order of x0, x1, x2, x3, x7, x6, x5, x4, x8, x9, x10, x11, x15, x14, x13, and x12.

The order of sorting is not limited to what is illustrated in FIG. 8A. The sorting may be carried out in some other suitable order. Other examples of sorting are illustrated in FIGS. 8B, 8C, and 8D.

When sorted as illustrated in FIG. 8B, the row vectors have their maximum values manifested in the order of x0, x1, x4, x8, x5, x2, x3, x6, x9, x12, x13, x10, x7, x11, x14, and x15.

When sorted as illustrated in FIG. 8C, the row vectors have their maximum values manifested in the order of x0, x1, x2, x3, x4, x5, x6, x7, x8, x9, x10, x11, x12, x13, x14, and x15.

When sorted as illustrated in FIG. 8D, the row vectors have their maximum values manifested in the order of x0, x1, x2, x3, x7, x11, x15, x14, x13, x12, x8, x4, x5, x6, x10, and x9.

The sampling matrix A may be converted using a sorting order other than those described above. Also, although the foregoing description has been given using the example in which the elements in the sampling matrix A each have the value of either 1 or 0, the elements are not limited to any specific values and may be set to any desired values including negative values, 0, or positive values. In a case where each of the elements has not the binary value of 1 or 0 but multiple values, the sampling matrix A may be converted by the method to be described below.

FIG. 9 is an explanatory diagram explaining a processing procedure for converting the sampling matrix A (i.e., sorting the row vectors) in a case where each of the elements in the sampling matrix A has multiple values. Note that numbers on the left in FIG. 9 are given there for explanatory purposes.

The processing in line 1 of FIG. 9 calculates a provisional value of a cost of the sampling matrix A. The cost in this context represents a sum of degrees of similarity between adjacent sampling matrices A and is defined by the mathematical expression (9) given below. Also, each degree of similarity is calculated using the mathematical expression (8) below.

[Math. 8]

$$\text{simirality}(A_i, A_j) = \frac{|A_i| \cdot |A_j|}{\langle A_i, A_j \rangle} \quad (8)$$

[Math. 9]

$$\text{Cost}(A) = \sum_{j=1}^{i} \text{simirality}(A_{j-1}, A_j) \quad (9)$$

The mathematical expression (8) above defining the degree of similarity makes use of the inner product between vectors. The expression (8) is used to calculate the degree of similarity using an inner product between a sampling matrix Ai and a sampling matrix Aj. In the case where the expression (8) is applied to the calculation using the same vector, the resulting value (degree of similarity) is 1. Also, in a case where the expression (8) is applied to the calculation using different vectors, the resulting value is 1 or larger. In the case where the expression (8) is applied to the calculation using totally incoherent vectors, the resulting value is an infinity value.

The processes from line 3 to line 7 calculates the degree of similarity and the cost using the calculated degree of similarity. The calculation of the degree of similarity and the cost involves sorting the row vectors in the sampling matrix A, as in the case of sorting the sampling matrices A0 to A5 as illustrated in FIG. 6, for example.

The processes from line 9 to line 16 updates the cost for comparison and thus updates a provisionally optimized sampling matrix A. Repeating the update provides the order in which the sampling matrix A with a minimum cost is applied.

For example, the processes from line 3 to line 7 performed on the sampling matrices A0 to A5 in FIG. 6 provides the degree of similarity between A0 and A1, the degree of similarity between A1 and A2, the degree of similarity between A2 and A3, the degree of similarity between A3 and A4, and the degree of similarity between A4 and A5 through calculations. The sum of these degrees of similarity is then calculated as the cost.

Such calculations of the cost are performed for each of all conceivable combinations (sorting orders) of the sampling matrices A0 to A5 (i.e., A0 to A5 are sorted). The sorting order having a minimum cost is then selected. The sorting order with the minimum cost indicates that the degrees of similarity between adjacent sampling matrices A0 to A5 are high (a small value close to 1 results from the mathematical expression (8) above). The sampling matrix A sorted in this manner is thus generated as the sampling matrix A' that is held in the sampling matrix holding part 25.

In a case where the elements in the sampling matrix A have multiple values each, the sampling matrix A' may be generated as illustrated in FIG. 9. Further, even in a case where the elements in the sampling matrix A have multiple values each, the sampling matrix A' may be generated with emphasis on the maximum value, as discussed above with reference to FIGS. 6, 7, 8A, 8B, 8C, and 8D.

Thus, according to the present technology, the randomly generated sampling matrix A is converted into the sampling matrix A' optimized for compression by the compression part 23. The converted sampling matrix A' is used for random sampling in the random sampling part 22. In the ensuing description, the converted sampling matrix A' will be also described again as the sampling matrix A.

A description of the wording "optimized for compression" will be given herein. What is important for compression is that the data to be input to the compression part 23 should be deviated, i.e., that the data should converge on limited values. The data with no (small) deviation has a large amount of information and is not suitable for compression. In contrast, data with much deviation has a small amount of information and is easily compressed. The amount of information is sometimes referred to as entropy.

According to the present technology, as described above, the row vectors of the sampling matrix A are sorted in such a manner that the output (observation coefficients y) resulting from random sampling using the sampling matrix A provides small similar values, i.e., small differential values, between the consecutive observation coefficients y.

Thus, the differential values can create a significantly deviated distribution of values centering on 0 and form a data string suitable for compression. That is, the sampling matrix A optimized for compression can be generated in the manner described above.

Also, according to the present technology, as will be described later, predictive values are also used in calculating the differential value. When the method for obtaining the predictive value for the current observation coefficient y is determined on the basis of past processing results, it is possible to design the sampling matrix A, such as one converging on 0s, that stochastically reduces the amount of information of the input coefficients and differential values.

In this description, the sampling matrix A that minimizes the amount of information of the input image, predictive values, and differential values is thus referred to as the sampling matrix A optimized for compression.

<Another Configuration of Compression Part>

The configuration and the operation of the compression part 23 will be further described herein again. The compression part 23 has a configuration illustrated in FIG. 5. As discussed above, the compression part 23 performs data compression by calculating the differential value between the observation coefficient y and the predictive value and then encoding the resulting value.

Figure 10:
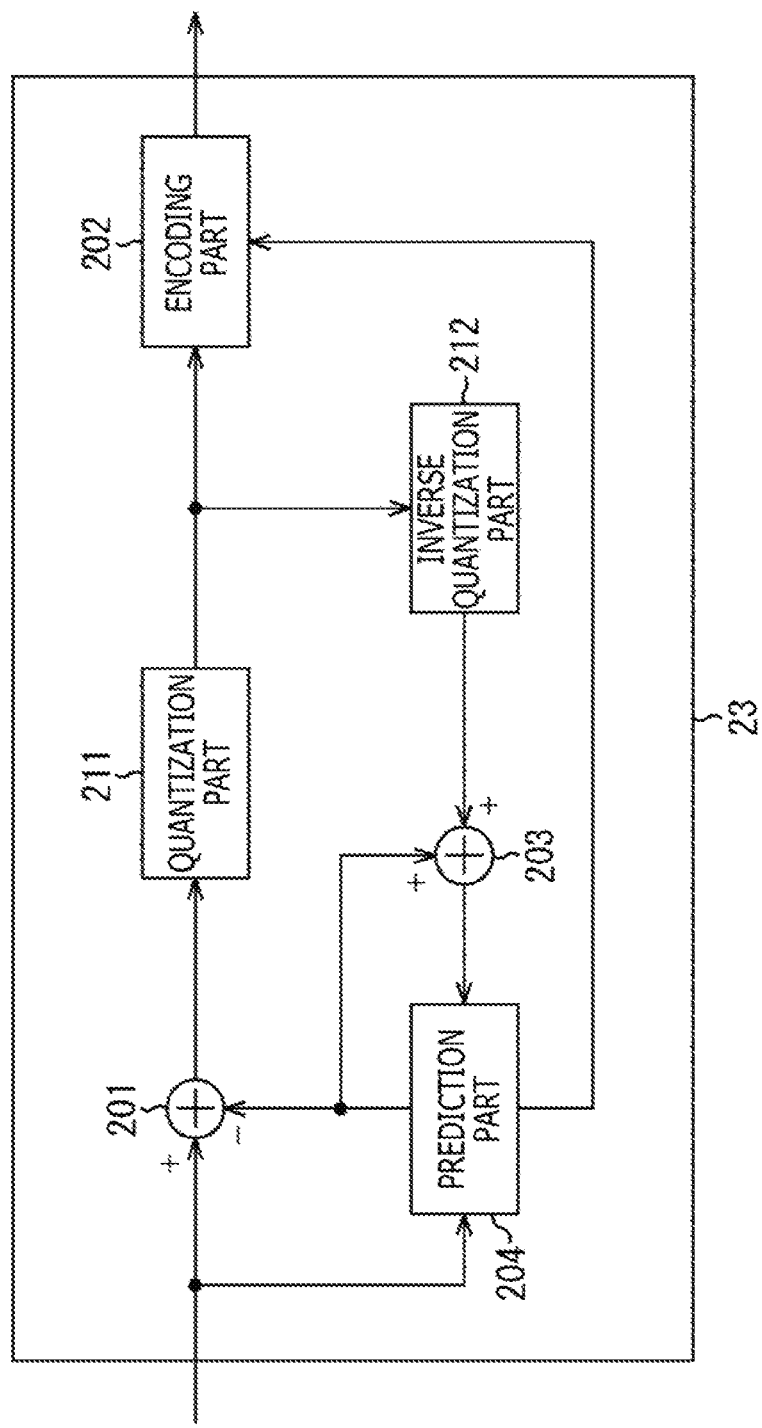
FIG. 10 is an explanatory diagram explaining another configuration of the compression part.

FIG. 10 illustrates another configuration of the compression part 23. The compression part 23 illustrated in FIG. 10 has such a configuration that a quantization part 211 and an inverse quantization part 212 are added in the compression part 23 illustrated in FIG. 5.

In the compression part 23 illustrated in FIG. 10, the observation coefficient y from the random sampling part 22 is input to the subtraction part 201 and to the prediction part 204. The subtraction part 201 subtracts the predictive value (referred to as a predictive value p hereunder) supplied from the prediction part 204, from the observation coefficient y, and outputs the resulting differential value to the quantization part 211.

The quantization part 211 quantizes the input differential value. For example, the quantization part 211 halves the input differential value and outputs the resulting value to the encoding part 202 and to the inverse quantization part 212. The differential value after quantization is encoded by the encoding part 202 to be output therefrom.

Figure 23:
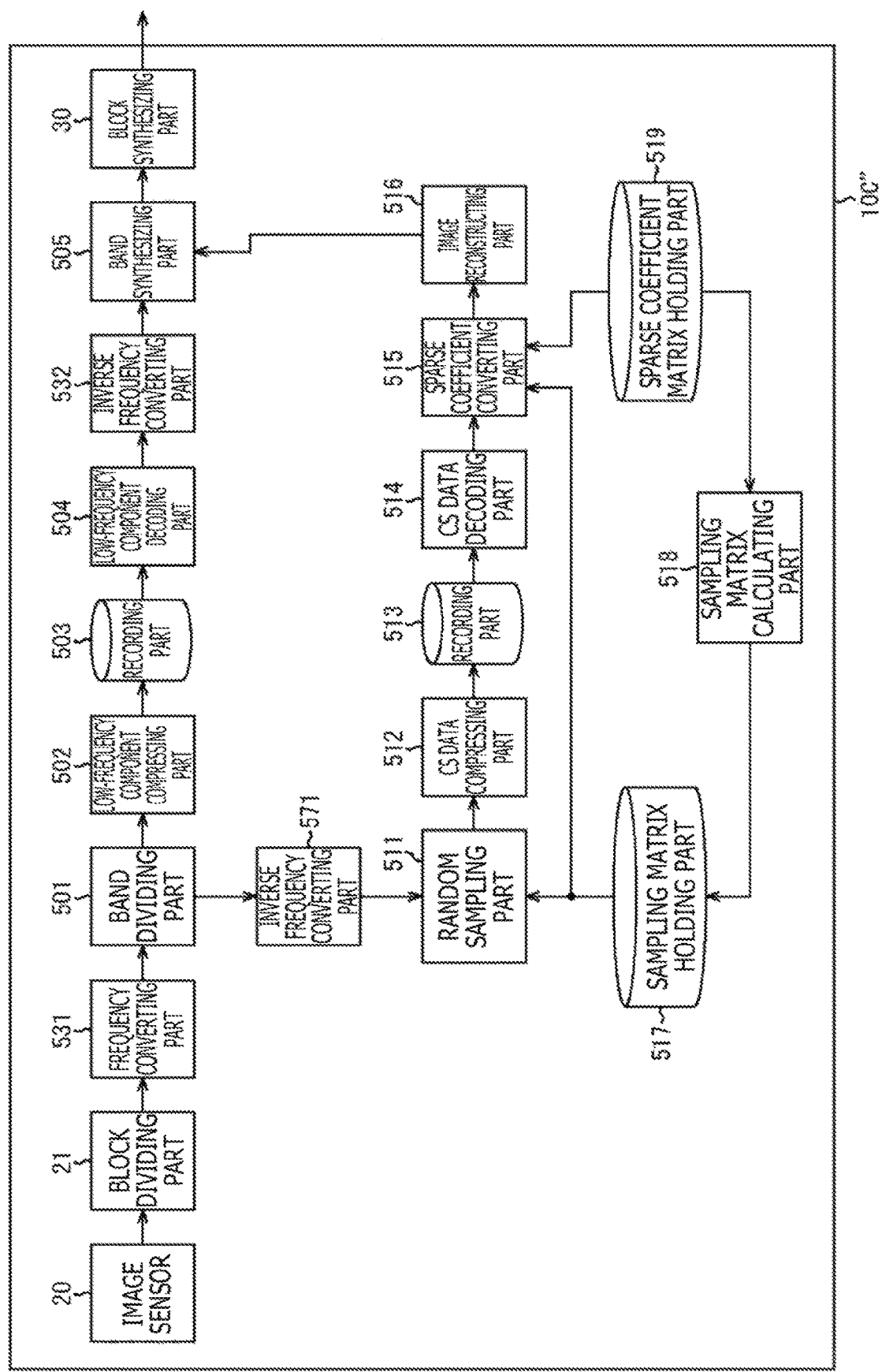
FIG. 23 is a schematic diagram illustrating still another configuration of the data processing apparatus in the third embodiment.

Also, the differential value after quantization is inversely quantized by the inverse quantization part 212. Thus, the differential value after quantization is returned to the differential value before quantization by the quantization part 211 to be supplied to the addition part 203. Whereas FIG. 23 illustrates a configuration in which the differential value before quantization is input to the addition part 203 through the process of the inverse quantization part 212, it may be configured that the inverse quantization part 212 is omitted and the differential value from the subtraction part 201 is input directly to the addition part 203.

By providing the quantization part 211 in this manner, quantizing the differential value makes it possible to convert the differential value into a small value, even if the differential value is significantly large. The differential values thus converted to small values are encoded, so that the compression part 23 further improves the efficiency of compression.

The addition part 203 adds up the differential value from the inverse quantization part 212 and the predictive value p from the prediction part 204 and outputs the sum to the prediction part 204. In the following description, the value output from the addition part 203 will be referred to as a locally decoded result where appropriate. The prediction part 204 compares the observation coefficient y from the random sampling part 22 with the locally decoded result from the addition part 203, sets accordingly a predictive mode to be described later, supplies the set predictive mode to the encoding part 202, and outputs the predictive value p corresponding to the predictive mode to the subtraction part 201.

Figure 11:
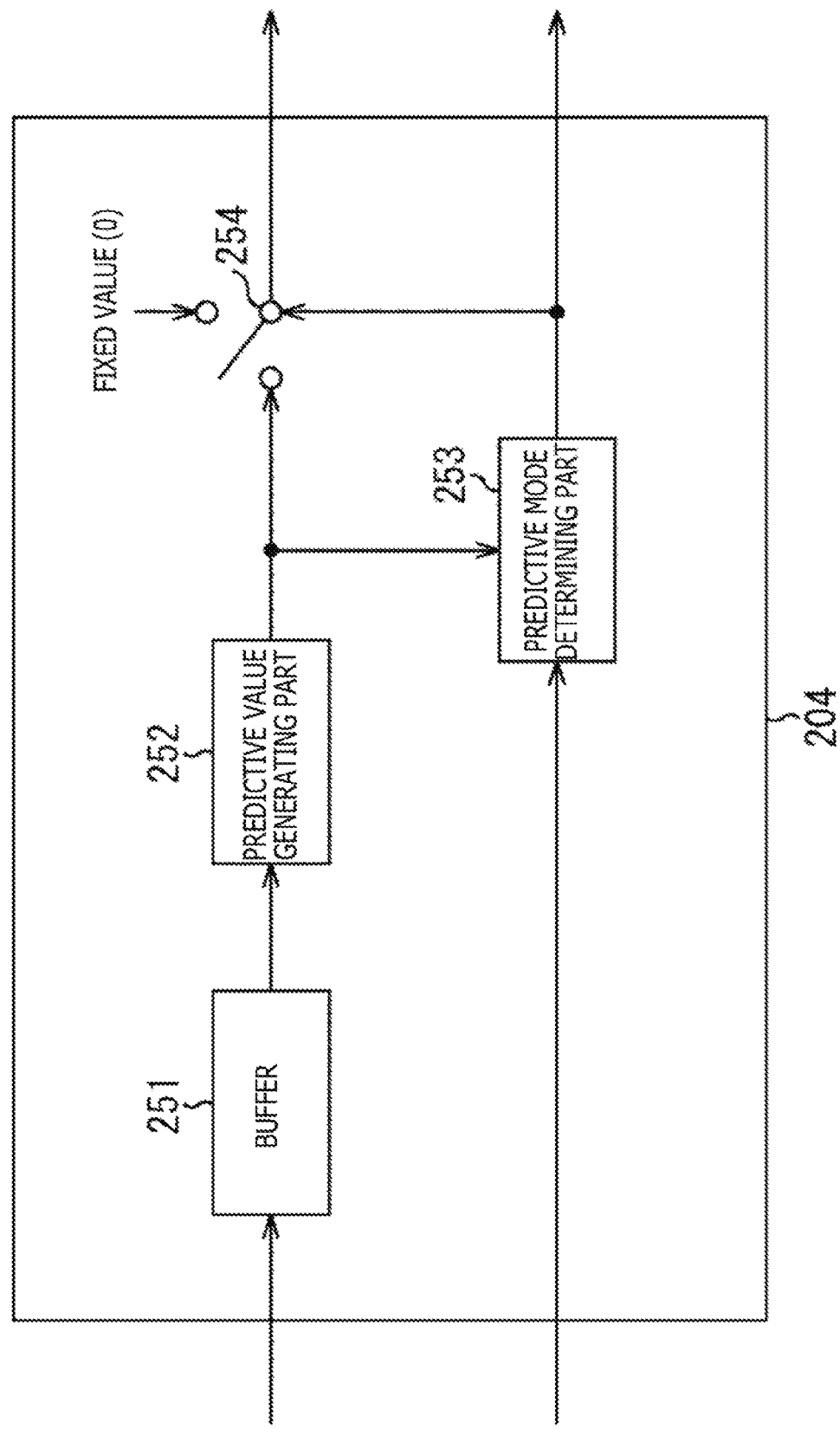
FIG. 11 is an explanatory diagram explaining a configuration of a prediction part.

FIG. 11 illustrates an internal configuration of the prediction part 204. The prediction part 204 includes a buffer 251, a predictive value generating part 252, a predictive mode determining part 253, and a switch 254.

The locally decoded result from the addition part 203 is input to and buffered by the buffer 251. The locally decoded result buffered by the buffer 251 is supplied to the predictive value generating part 252 at a predetermined timing. The predictive value generating part 252 generates the predictive value p by a method to be described later, and outputs the generated predictive value p to the switch 254. In accordance with the predictive mode from the predictive mode determining part 253, the switch 254 is switched to output the predictive value p from the predictive value generating part 252 or a fixed value (0) to the subtraction part 201 (FIG. 10).

The observation coefficient y from the random sampling part 22 and the predictive value p from the predictive value generating part 252 are input to the predictive mode determining part 253. The predictive mode determining part 253 determines whether a prediction mode or a non-prediction mode is to be selected using the observation coefficient y and the predictive value p. Here, the prediction mode is a mode in which compression is performed and the differential value is output. The non-prediction mode is a mode in which compression is not carried out and the observation coefficient y, not the differential value, is output as it is.

In a case where the predictive mode determining part 253 determines that the prediction mode is to be selected, the switch 254 is switched to output the predictive value p from the predictive value generating part 252 to the subtraction part 201 (FIG. 10). Also, in the case where the predictive mode determining part 253 determines that the prediction mode is to be selected, the predictive mode determining part 253 outputs information indicating that the selection is the prediction mode, "0" in this case, to the encoding part 202. The encoding part 202 performs a process of including into a stream of encoded data the information "0" indicating that the prediction mode is in effect.

Conversely, in a case where the predictive mode determining part 253 determines that the non-prediction mode is to be selected, the switch 254 is switched to output the fixed value (0) to the subtraction part 201 (FIG. 10). Also, in the case where the predictive mode determining part 253 determines that the non-prediction mode is to be selected, the predictive mode determining part 253 outputs information indicating that the selection is the non-prediction mode, "1" in this case, to the encoding part 202. The encoding part 202 performs a process of including into the stream the information "1" indicating that the non-prediction mode is in effect.

Given below is a description of the compression process in the compression part 23 including the prediction part 204 described above.

The compression part 23 applies compression to the observation coefficients y after being subjected to compressed sensing from the random sampling part 22. The observation coefficients are values calculated as described above (i.e., the values resulting from the compression). The mathematical expression (10) of compressed sensing is again given below.

[Math. 10]

$$y = Ax = \begin{bmatrix} y_0 \\ y_1 \\ y_2 \\ y_3 \\ y_4 \\ \vdots \\ y_i \end{bmatrix} \tag{10}$$

The observation coefficients $y_0, y_1, y_2, y_3, y_4, \ldots, y_i$ are input, in this order, to the compression part 23. This sequence results from the compressed sensing by the use of the sampling matrix A optimized for compression, as described above, and the successively input observation coefficients y have high correlations therebetween.

First, the observation coefficient $y_0$ is input to the subtraction part 201 and to the prediction part 204 in the compression part 23. When the observation coefficient $y_0$ is encoded, the prediction part 204 does not output the predictive value p (the fixed value (0) is output). Thus, the subtraction part 201 outputs the observation coefficient $y_0$ as the differential value (differential value $y_0$ in this case) to the quantization part 211.

Also at this point, the predictive mode determining part 253 in the prediction part 204 (FIG. 11) determines that the non-prediction mode is selected, and accordingly, the switch 254 is switched to the fixed value (0). Thus, the observation coefficient $y_0$ is output unchanged from the subtraction part 201 to the quantization part 211, as described above.

The quantization part 211 quantizes the observation coefficient $y_0$ (differential value $y_0$) with a predetermined quantization value, and outputs the result to the encoding part 202. Alternatively, the quantization part 211 may also be configured to have the quantization value dynamically changed. In a case where the quantization part 211 is configured to have the quantization value dynamically changed, there may be provided a scheme in which the dynamically changed quantization value is transmitted to the decoding side (i.e., decoding part 27 in FIG. 1) where the quantization value is decoded and the quantization value can be identified on the decoding side.

The encoding part 202 encodes the differential value $y_0$ through a predetermined encoding method such as the Huffman coding method, and outputs the result as a stream. In this case, a description will be given assuming that the encoding part 202 uses the Huffman coding method for encoding. Alternatively, a suitable encoding method other than the Huffman coding method may be applied to the present technology.

As another alternative, since prediction is not applied to the differential value $y_0$ (observation coefficient $y_0$), the encoding part 202 may perform encoding using a fixed length set for each quantization value beforehand instead of using Huffman coding.

The quantized differential value $y_0$ encoded by the encoding part 202 and output as the stream is also supplied to the inverse quantization part 212 for inverse quantization. The differential value $y_0$ inversely quantized by the inverse quantization part 212 is supplied to the addition part 203 where the differential value y0 is added to the predictive value p from the prediction part 204. In this case, the predictive value p is "0," so that the output from the addition part 203 is the differential value y0 (referred to as a locally decoded result y0).

The output from the addition part 203 is the observation coefficient y obtained on the decoding side. That is, the addition part 203 reconstructs the observation coefficient y to be acquired on the decoding side. The reconstructed observation coefficient y (in this case, observation coefficient y0=locally decoded result y0) is supplied to the prediction part 204 to be used for generating the observation coefficient y1 and subsequent coefficients.

The locally decoded result y0 from the addition part 203 is input to and buffered by the buffer 251 (FIG. 11) in the prediction part 204. Meanwhile, the next observation coefficient y1 is input to the subtraction part 201 and to the prediction part 204 in the compression part 23. The prediction part 204 determines whether or not to perform prediction and generates a predictive value.

The predictive value generating part 252 in the prediction part 204 generates the predictive value on the basis of the information in the buffer 251 (locally decoded result y0 in this case). Although the method of generating the predictive value will be described later, a description will be given as one example method thereof, using a method that involves using a neighbor value unchanged as the predictive value.

In this case, the observation coefficient y1 is targeted for compression. The neighbor value of the observation coefficient y1 is the observation coefficient y0. Also, the observation coefficient y0 is the same as the locally decoded result y0 currently buffered by the buffer 251. Thus, at this point, the predictive value generating part 252 generates the observation coefficient y0 as the predictive value, and outputs the generated value to the switch 254 and to the predictive mode determining part 253.

The predictive mode determining part 253 determines the predictive mode using the predictive value (observation coefficient y0 in this case) from the predictive value generating part 252, and the observation coefficient y (observation coefficient y1 in this case) from the random sampling part 22. This method of predictive mode determination is not subject to any particular limitations. One way of carrying out the method is as follows:

(1) The predictive value is subtracted from the input observation coefficient y. The resulting differential value is subjected to variable-length coding so as to calculate a code length at this point.

(2) The code length calculated in step (1) above is compared with an amount of bits generated at the time of fixed-length coding.

(3) In a case where the code length calculated in step (1) above is less than the amount of bits generated at the time of fixed-length coding as a result of comparison therebetween, the prediction mode is set, and "0" is output. In a case where the code length calculated in step (1) above is more than the amount of bits generated at the time of fixed-length coding, the non-prediction mode is set, and "1" is output.

In the case where the prediction mode is set, the switch 254 is switched such that the predictive value from the predictive value generating part 252 is output to the subtraction part 201 (FIG. 10). Also, in the case where the non-prediction mode is set, the switch 254 is switched such that the fixed value (0) is output to the subtraction part 201 (FIG. 10).

In this case, a description will be given assuming that the observation coefficient y1 targeted for compression is processed in the prediction mode.

With the prediction mode set by the predictive mode determining part 253, the switch 254 is operated to supply the predictive value (observation coefficient y0 in this case) generated in the predictive value generating part 252 to the subtraction part 201. The observation coefficient y0 is thus output to the subtraction part 201.

Because the subtraction part 201 is supplied with the observation coefficient y1 from the random sampling part 22, the subtraction part 201 performs the process of subtracting the observation coefficient y0 from the observation coefficient y1. As a result of this, the subtraction part 201 outputs the differential value (y1−y0) to the quantization part 211.

The quantization part 211 quantizes the differential value (y1−y0) with a predetermined quantization value, and outputs the result to the encoding part 202. The encoding part 202 encodes the quantized differential value (y1−y0) and outputs the result as a stream.

The quantized differential value (y1−y0) is also supplied to the inverse quantization part 212 for inverse quantization. The differential value (y1−y0) inversely quantized by the inverse quantization part 212 is supplied to the addition part 203 where the value is added up with the predictive value p from the prediction part 204. Since the predictive value p at this point is the observation coefficient y0, the addition part 203 adds up the differential value (y1−y0) and the observation coefficient y0. The observation coefficient y1 as the sum of the addition is output to the prediction part 204.

The observation coefficients y are compressed and output as the stream when the above process is repeated in the compression part 23.

Figure 12:
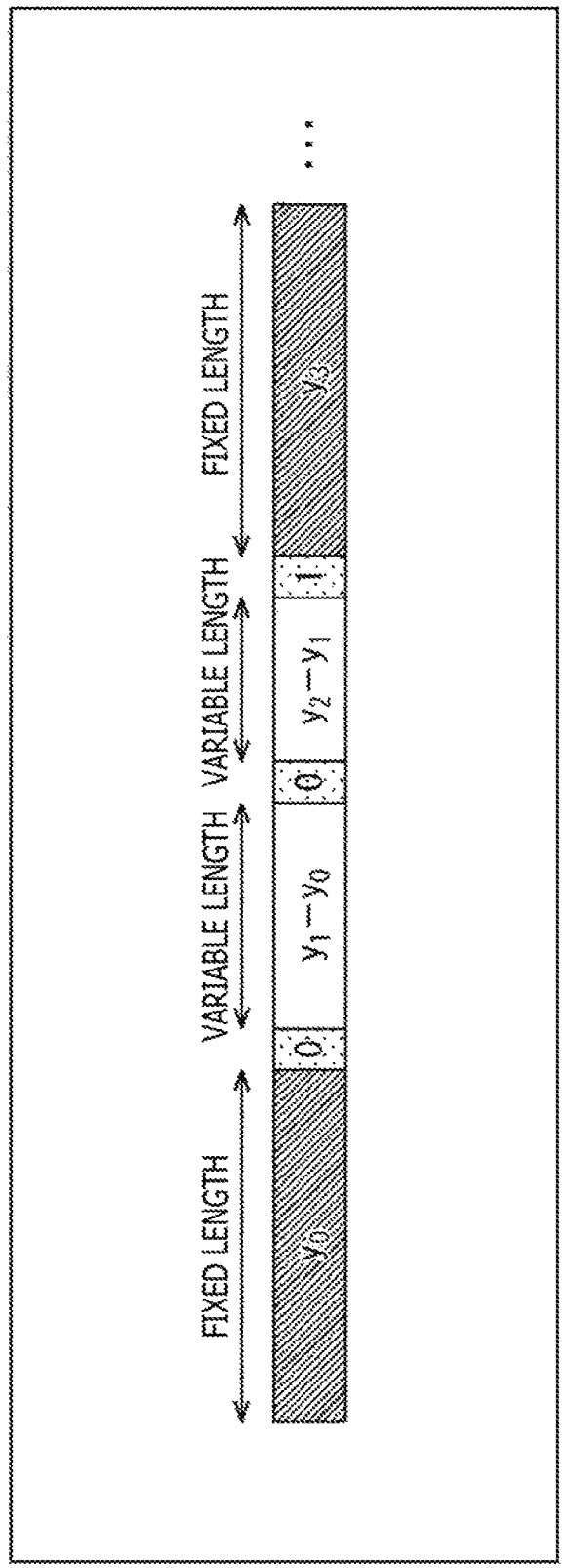
FIG. 12 is a schematic diagram illustrating a typical stream output from the compression part.

FIG. 12 illustrates a typical stream that is output. The quantized differential value y0 (simply described as the differential value y0 hereunder; similar descriptions also apply elsewhere) is compressed in the non-compression mode and output in a fixed length. Because the differential value y0 (a coefficient that serves as a reference for differential value calculation) is always output in a fixed length, it is optional to attach the information indicating the predictive mode being in effect. The example illustrated in FIG. 12 has no such information attached.

After the differential value y0 is output in a fixed length, the information indicating the predictive mode is output. In the example of FIG. 12, the information "0" indicating that the prediction mode is set is attached. This information is followed by the output of the differential value (y1−y0). The differential value (y1−y0) applicable when prediction (compression) mode is in effect is output as variable-length data.

The output of the variable-length differential value (y1−y0) is followed by the output of the information indicating the predictive mode. In FIG. 12, the information "0" indicating that the prediction mode is set is attached. This information is followed by the output of the differential value (y2−y1). The differential value (y2−y1) is output as variable-length data because the differential value (y2−y1) is applicable at the time of the prediction (compression) mode.

The output of the variable-length differential value (y2−y0) is followed by the output of the information indicating the predictive mode. In FIG. 12, the information "1" indicating that the non-prediction mode is set is attached. This information is followed by the output of the differential value (y3). The differential value (y3), not applicable at the time of the prediction (compression) mode, is therefore the observation coefficient y3 and is output as fixed-length data.

The above-described stream is output from the compression part 23.

<Generation of Predictive Value>

Figure 13:
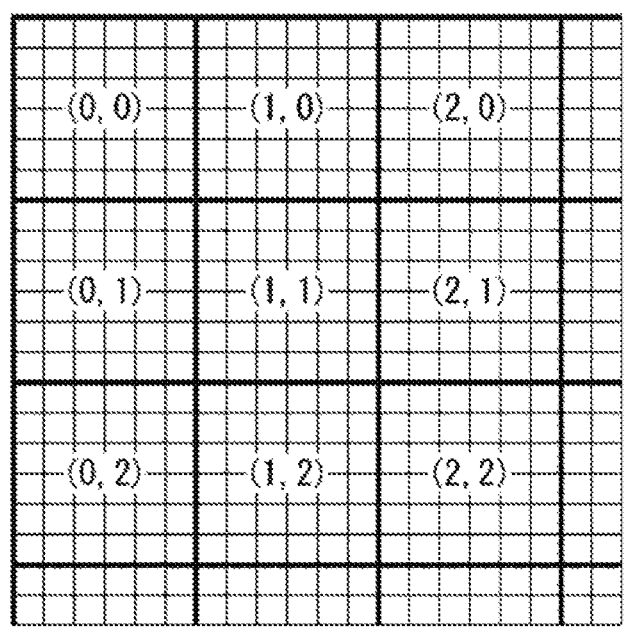
FIG. 13 is an explanatory diagram explaining how divided blocks are numbered.

Net, a description will be given regarding how the predictive value is generated in the predictive value generating part 252 in the prediction part 204. First, each of the blocks of the image divided by the block dividing part 21 (FIG. 1) is defined as illustrated in FIG. 13. In FIG. 13, the block in the top left position is defined as a block (0, 0), for example. The block located immediately to the right (in the x-axis direction) of the block (0, 0) is defined as block (1, 0). The block located immediately below (in the y-axis direction) the block (0, 0) is defined as a block (0, 1). The other blocks are defined in like manner.

Also, the mathematical expression (11) below defines the coefficients obtained by randomly sampling a block (h, v) using the sampling matrix A. Moreover, the mathematical expression (12) below defines the result of compressing and decoding the coefficients of the block (h, v) indicated by the expression (11), i.e., the locally decoded result of the coefficients.

[Math. 11]

$$\begin{bmatrix} y_{h,v,0} \\ y_{h,v,1} \\ y_{h,v,2} \\ y_{h,v,3} \\ y_{h,v,4} \\ \vdots \\ y_{h,v,i} \end{bmatrix} \quad (11)$$

[Math. 12]

$$\begin{bmatrix} c_{h,v,0} \\ c_{h,v,1} \\ c_{h,v,2} \\ c_{h,v,3} \\ c_{h,v,4} \\ \vdots \\ c_{h,v,i} \end{bmatrix} \quad (12)$$

A description will be given regarding cases where the predictive value is predicted within the block to be generated.

(First Generation of Predictive Value)

The neighbor value is used unchanged as the predictive value. This generation method has been already described above. The method is defined by the mathematical expression (13) below, where P denotes the predictive value.

[Math. 13]

$$p_{h,v,k} = y_{h,v,k-1} \quad (13)$$

In a case where the compression part 23 includes the quantization part 211 as illustrated in FIG. 10, the method is defined by the mathematical expression (14) below.

[Math. 14]

$$p_{h,v,k} = c_{h,v,k-1} \quad (14)$$

In a case where the predictive value is generated by the mathematical expression (13) above, the predictive value applicable when the observation coefficient y1 (when $y_{h,v,k} = y_{h,v,1}$), for example, is targeted for compression is the observation coefficient y0 ($=y_{h,v,0}$).

(Second Generation of Predictive Value)

A mean value of the immediate neighbor values is used to obtain the predictive value. This method is defined by the mathematical expression (15) below.

[Math. 15]

$$p_{h,v,k} = (y_{h,v,k-1} + y_{h,v,k-2})/2 \quad (15)$$

In the case where the compression part 23 includes the quantization part 211 as illustrated in FIG. 10, this method is defined by the mathematical expression (16) below.

[Math. 16]

$$p_{h,v,k} = (c_{h,v,k-1} + c_{h,v,k-2})/2 \quad (16)$$

In a case where the predictive value is generated by the mathematical expression (15) above, the predictive value applicable when the observation coefficient y2 (when $y_{h,v,k} = y_{h,v,2}$), for example, is targeted for compression is obtained by adding up the observation coefficient y0 ($=y_{h,v,0}$) and the observation coefficient y0 ($=y_{h,v,1}$) and by multiplying the sum by 2.

(Third Generation of Predictive Value)

A linear sum of proximate mean values is used to obtain the predictive value. This method is defined by the mathematical expressions below. In the expressions (17) and (18), reference character a denotes weight. All coefficients are multiplied by the same weight.

[Math. 17]

$$p_{h,v,k} = a_1 \cdot y_{h,v,k-1} + a_2 \cdot y_{h,v,k-2} + a_3 \cdot y_{h,v,k-3} + \ldots = \sum_{l=1}^{n} a_l \cdot y_{h,v,k-l} \quad (17)$$

In the case where the compression part 23 includes the quantization part 211 as illustrated in FIG. 10, this method is defined by the mathematical expression (18) below.

[Math. 18]

$$p_{h,v,k} = a_1 \cdot c_{h,v,k-1} + a_2 \cdot c_{h,v,k-2} + a_3 \cdot c_{h,v,k-3} + \ldots = \sum_{l=1}^{n} a_l \cdot c_{h,v,k-l} \quad (18)$$

In a case where the predictive value is generated by the mathematical expression (17) above, the predictive value applicable when the observation coefficient yn (when $y_{h,v,k} = y_{h,v,n}$), for example, is targeted for compression is obtained by having each of the observation coefficient y0 ($=y_{h,v,0}$), the observation coefficient y1 ($=y_{h,v,1}$) ..., and the observation coefficient yn−1 ($=y_{h,v,n-1}$) multiplied by the weight a and then adding up the values each multiplied by the weight a.

(Fourth Generation of Predictive Value)

Similarly to the above-described third generation, this method involves using the linear sum of the proximate mean values to obtain the predictive value, but the weight by which each of the coefficients is multiplied is different. The method is defined by the mathematical expressions below. In the expressions (19) and (20), the reference character a denotes the weight that differs from one coefficient to another. Also, the weight a is dependent on where each coefficient is located. For example, the closer the coefficient is to the processing target, the larger the value of the weight a; the farther the coefficient is from the processing target, the smaller the value of the weight a.

[Math. 19]

$$p_{h,v,k} = a_{k,1} \cdot y_{h,v,k-1} + a_{k,2} \cdot y_{h,v,k-2} + a_{k,3} \cdot y_{h,v,k-3} + \ldots = \sum_{l=1}^{n} a_{k,l} \cdot y_{h,v,k-l} \quad (19)$$

In the case where the compression part 23 includes the quantization part 211 as illustrated in FIG. 10, this method is defined by the mathematical expression (20) below.

[Math. 20]

$$p_{h,v,k} = a_{k,1} \cdot c_{h,v,k-1} + a_{k,2} \cdot c_{h,v,k-2} + a_{k,3} \cdot c_{h,v,k-3} + \ldots = \sum_{l=1}^{n} a_{k,l} \cdot c_{h,v,k-l} \quad (20)$$

In a case where the predictive value is generated by the mathematical expression (19) above, the predictive value applicable when the observation coefficient yn (when $y_{h,v,k} = y_{h,v,n}$), for example, is targeted for compression is obtained by having each of the observation coefficient y0 ($=y_{h,v,0}$), the observation coefficient y1 ($=y_{h,v,1}$), . . . , and the observation coefficient yn−1 ($=y_{h,v,n-1}$) multiplied by different weight a and then adding up the values each multiplied by the weight a.

A description will be given regarding cases where the predictive value is predicted between blocks to be generated.

(Fifth Generation of Predictive Value)

The observation coefficient y in the same position in the adjacent block is used to obtain the predictive value. This method is defined by the mathematical expression (21) below.

[Math. 21]

$$p_{h,v,k} = y_{h,v-1,k} \quad (21)$$

In the case where the compression part 23 includes the quantization part 211 as illustrated in FIG. 10, this method is defined by the mathematical expression (22) below.

[Math. 22]

$$p_{h,v,k} = c_{h,v-1,k} \quad (22)$$

In a case where the predictive value is generated by the mathematical expression (21) above, the predictive value applicable when the observation coefficient y1 of the block (1, 1) (when $y_{h,v,k} = y_{1,1,1}$), for example, is targeted for compression is the observation coefficient y1 ($=y_{1,0,1}$) in the adjacent block (1, 0).

(Sixth Generation of Predictive Value)

Values of multiple adjacent blocks are used to obtain the predictive value. This method is defined by the mathematical expression (23) below.

[Math. 23]

$$p_{h,v,k} = y_{h,v-1,k} + y_{h-1,v,k} - y_{h-1,v-1,k} \quad (23)$$

In the case where the compression part 23 includes the quantization part 211 as illustrated in FIG. 10, this method is defined by the mathematical expression (24) below.

[Math. 24]

$$p_{h,v,k} = c_{h,v-1,k} + c_{h-1,v,k} - c_{h-1,v-1,k} \quad (24)$$

In a case where the predictive value is generated by the mathematical expression (23) above, the predictive value applicable when the observation coefficient y1 of the block (1, 1) (when $y_{h,v,k} = y_{1,1,1}$), for example, is targeted for compression is obtained by adding up the observation coefficient y1 ($=y_{1,0,1}$) in the adjacent block (1, 0) and the observation coefficient y1 ($=y_{0,1,1}$) in the adjacent block (0, 1) and then subtracting the observation coefficient y1 ($=y_{0,0,1}$) in the block (0, 0) from the sum of the addition.

(Seventh Generation of Predictive Value)

Similarly to the sixth generation, this method involves using the values of multiple adjacent blocks to obtain the predictive value through a method known as median prediction. The method is defined by the mathematical expression (25) below.

[Math. 25]

$$p_{h,v,k} = \mathrm{clip}(y_{h,v-1,k} + y_{h-1,v,k} - y_{h-1,v-1,k},$$

$$\min(y_{h,v-1,k}, y_{h-1,v,k}),$$

$$\max(y_{h,v-1,k}, y_{h-1,v,k})) \quad (25)$$

In the case where the compression part 23 includes the quantization part 211 as illustrated in FIG. 10, this method is defined by the mathematical expression (26) below.

[Math. 26]

$$p_{h,v,k} = \mathrm{clip}(c_{h,v-1,k} + c_{h-1,v,k} - c_{h-1,v-1,k},$$

$$\min(c_{h,v-1,k}, c_{h-1,v,k}),$$

$$\max(c_{h,v-1,k}, c_{h-1,v,k})) \quad (26)$$

In the case where the predictive value is generated by the mathematical expression (25) above, the predictive value applicable when the observation coefficient y1 of the block (1, 1) (when $y_{h,v,k} = y_{1,1,1}$), for example, is targeted for compression is obtained by adding up the observation coefficient y1 ($=y_{1,0,1}$) in the adjacent block (1, 0) and the observation coefficient y1 ($=y_{0,1,1}$) in block (0, 1) and then subtracting the observation coefficient y1 ($=y_{0,0,1}$) in the block (0, 0) from the sum of the addition (the difference is taken as the first value).

Further, the smaller one of the two values, i.e., of the observation coefficient y1 ($=y_{1,0,1}$) in the block (1, 0) and the observation coefficient y1 ($=y_{0,1,1}$) in the block (0, 1), is calculated (as the second value). Likewise, the larger one of the two values, i.e., of the observation coefficient y1 ($=y_{1,0,1}$) in the block (1, 0) and the observation coefficient y1 ($=y_{0,1,1}$) in the block (0, 1), is calculated (as the third value). The median of the first, the second, and the third values is then used as the predictive value.

A description will be given regarding cases where the predictive value is predicted within the block and between blocks to be generated.

(Eighth Generation of Predictive Value)

The values of multiple blocks and the neighbor value in the same block are used to obtain the predictive value. This method is defined by the mathematical expression (27) below.

[Math. 27]

$$p_{h,v,k} = y_{h,v-1,k} + y_{h,v,k-1} - y_{h,v-1,k-1} \quad (27)$$

In the case where the compression part 23 includes the quantization part 211 as illustrated in FIG. 10, this method is defined by the mathematical expression (28) below.

[Math. 28]

$$p_{h,v,k} = c_{h,v-1,k} + c_{h,v,k-1} - c_{h,v-1,k-1} \quad (28)$$

In a case where the predictive value is generated by the mathematical expression (27) above, the predictive value applicable when the observation coefficient y1 of the block (1, 1) (when $y_{h,v,k} = y_{1,1,1}$), for example, is targeted for compression is obtained by adding up the observation coefficient y1 ($=y_{1,0,1}$) in the adjacent block (1, 0) and the adjacent observation coefficient y0 ($=y_{1,1,0}$) in the same block (1, 1) and then subtracting from the sum of the addition the observation coefficient y0 (=$y_{1,0,0}$) adjacent to the observation coefficient y1 in the adjacent block (1, 0).

(Ninth Generation of Predictive Value)

Similarly to the eighth generation, this method involves using the values of multiple adjacent blocks and adjacent values in the same block to obtain the predictive value through the method known as median prediction. The method is defined by the mathematical expression (29) below.

[Math. 29]

$$p_{h,v,k} = \text{clip}(y_{h,v-1,k} + y_{h,v,k-1} - y_{h,v-1,k-1},$$

$$\min(y_{h,v-1,k}, y_{h,v,k-1}),$$

$$\max(y_{h,v-1,k}, y_{h,v,k-1})) \quad (29)$$

In the case where the compression part 23 includes the quantization part 211 as illustrated in FIG. 10, this method is defined by the mathematical expression (30) below.

[Math. 30]

$$p_{h,v,k} = \text{clip}(c_{h,v-1,k} + c_{h,v,k-1} - c_{h,v-1,k-1},$$

$$\min(c_{h,v-1,k}, c_{h,v,k-1}),$$

$$\max(c_{h,v-1,k}, c_{h,v,k-1})) \quad (30)$$

In a case where the predictive value is generated by the mathematical expression (29) above, the predictive value applicable when the observation coefficient y1 of the block (1, 1) (when $y_{h,v,k} = y_{1,1,1}$), for example, is targeted for compression is obtained by adding up the observation coefficient y1 (=$y_{1,0,1}$) in the adjacent block (1, 0) and the adjacent observation coefficient y0 (=$y_{1,1,0}$) in the same block (1, 1) and then subtracting the observation coefficient y0 (=$y_{1,0,0}$) adjacent to the observation coefficient y1 in the adjacent block (1, 0) from the sum of the addition (the difference is taken as the first value).

Further, the smaller one of the two values, i.e., of the observation coefficient y1 (=$y_{1,0,1}$) in the block (1, 0) and the adjacent observation coefficient y0 (=$y_{1,1,0}$) in the block (1, 1), is calculated (as the second value). Likewise, the larger one of the two values, i.e., of the observation coefficient y1 (=$y_{1,0,1}$) in the block (1, 0) and the adjacent observation coefficient y0 (=$y_{1,1,0}$) in the block (1, 1), is calculated (as the third value). The median of the first, the second, and the third values is used as the predictive value.

The predictive value is generated using any of the methods of the first through the ninth generations of the predictive value. Also, the predictive value may be generated using some other suitable method not discussed here.

<Configuration and Operation of Decoding Part>

Next, a description will be given regarding the configuration and the operation of the decoding part 27 decoding the observation coefficients y compressed as described above.

Figure 14:
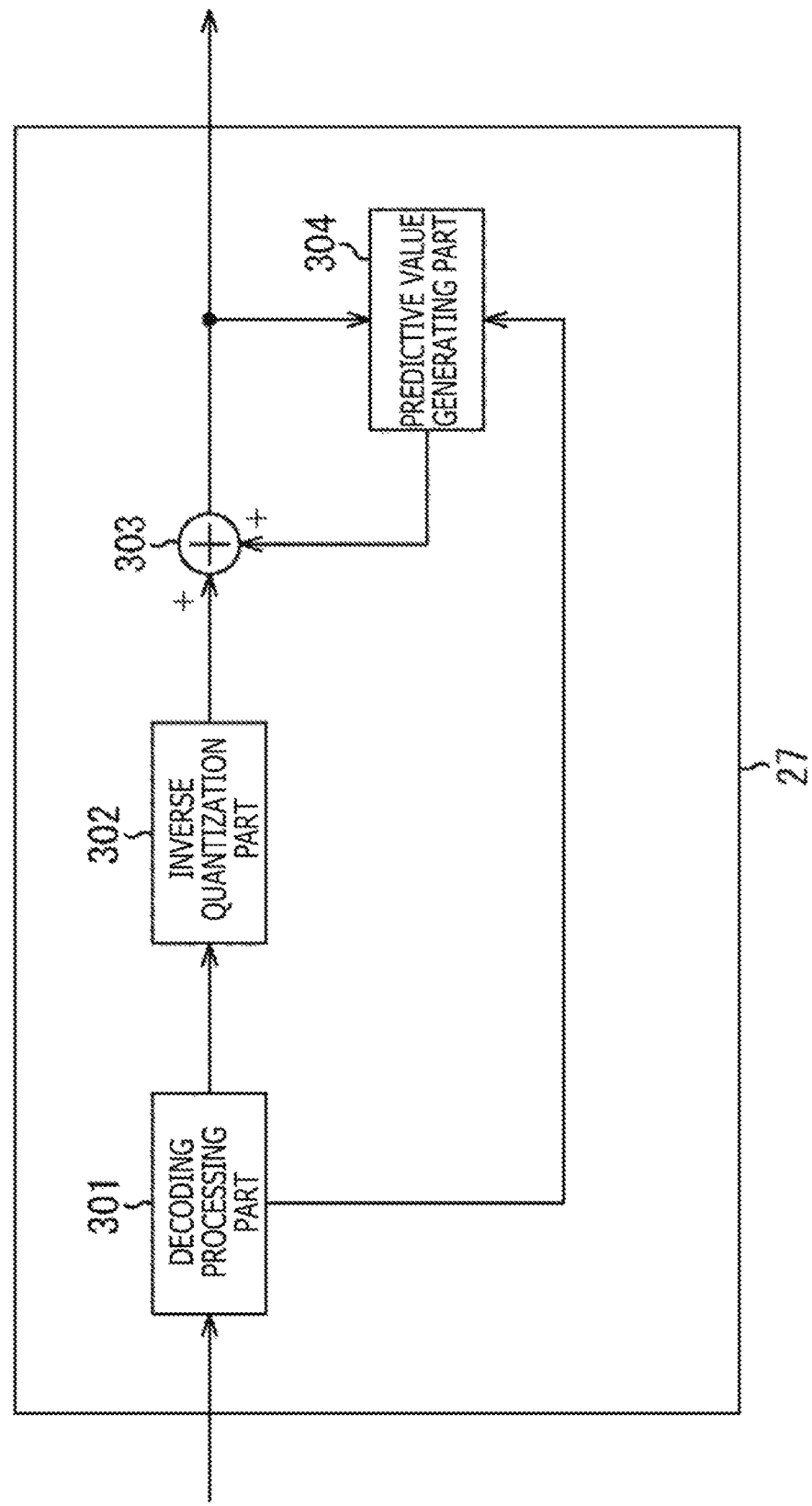
FIG. 14 is an explanatory diagram explaining a configuration of a decoding part.

FIG. 14 illustrates a configuration of the decoding part 27. The decoding part 27 includes a decoding processing part 301, an inverse quantization part 302, an addition part 303, and a predictive value generating part 304. Note that the configuration of the decoding part 27 illustrated in FIG. 14 corresponds to the configuration of the compression part 23 illustrated in FIG. 10. The decoding part 27 corresponding to the compression part 23 illustrated in FIG. 5 is configured without the inverse quantization part 302.

The decoding processing part 301 in the decoding part 27 is supplied with the stream recorded in the recording part 24 (FIG. 1), such as one illustrated in FIG. 12. When supplied with the stream illustrated in FIG. 12, the decoding processing part 301 first decodes the quantized differential value y0 (observation coefficient y0) having a fixed length through the decoding method corresponding to the encoding method used by the encoding part 202 (FIG. 10).

When decoding the differential value y0, the decoding processing part 301 supplies the predictive value generating part 304 with the information indicating that the non-prediction mode is being set, i.e., with "1" in this case.

The inverse quantization part 302 inversely quantizes the quantized differential value y0 from the decoding processing part 301. This process may be performed in the same manner as that performed by the inverse quantization part 212 in the compression part 23 (FIG. 10). The differential value y0 inversely quantized by the inverse quantization part 302 is supplied to the addition part 303. The addition part 303 is also supplied with the predictive value p from the predictive value generating part 304.

Because the predictive value generating part 304 is supplied with the information indicating that the non-prediction mode is being set (i.e., because the observation coefficient y serving as the reference for the difference is prescribed to be compressed to a fixed length), the predictive value "0" is output to the addition part 303. Thus, the addition part 303 outputs the sum of the differential value y0 and "0" to the sparse coefficient converting part 28 (FIG. 1) in the latter stage as the decoding result, i.e., as the observation coefficient y0.

At the next point in time, the data "0" next to the differential value y0 in the stream illustrated in FIG. 12 is input to the decoding processing part 301. The data "0" is information indicating that the next data applies when the prediction mode is being set. When the decoding processing part 301 outputs the information "0" to the predictive value generating part 304, the predictive value generating part 304 is set for the prediction mode.

After the data "0" indicating prediction mode is input to the decoding processing part 301, the quantized differential value (y1−y0) having a variable length is input thereto. The decoding processing part 301 decodes the input differential value (y1−y0) using a predetermined decoding method.

The inverse quantization part 302 inversely quantizes the quantized differential value (y1−y0) from the decoding processing part 301. The differential value (y1−y0) inversely quantized by the inverse quantization part 302 is supplied to the addition part 303. The addition part 303 is also supplied with the predictive value from the predictive value generating 304.

Because the predictive value generating part 304 is supplied with the information indicating that the prediction mode is being set, the predictive value generating part 304 generates the predictive value p and outputs the generated value to the addition part 303. The predictive value generating part 304 generates the predictive value p in the same process as that performed by the predictive value generating part 252 in the prediction part 204 of the compression part 23.

For example, in accordance with the above-described first generation of the predictive value, the adjacent observation coefficient y is output as the predictive value. In this case, the predictive value is the observation coefficient y0 when the differential value (y1−y0) is supplied to the addition part 303. Thus, the addition part 303 outputs to the sparse coefficient converting part 28 (FIG. 1) in the latter stage the sum of the differential value (y1−y0) and the observation coefficient y0 as the decoding result, i.e., as the observation coefficient y1.

The observation coefficients y are decoded in the decoding part 27 repeating the above-described process.

According to the present technology, the sampling matrix optimized for compression by the compression part 23 is designed in this manner. Also, the compression by compressed sensing is carried out in the former stage of the compression by the compression part 23 using the sampling matrix optimized for compression by the compression part 23. Furthermore, the result of the compressed sensing (observation coefficients y) is compressed by the compression part 23.

The sampling matrix optimized for compression by the compression part 23 can be designed by using the correlations in the spatial direction in the image. Also, when the sampling matrix is designed by using the correlations in the spatial direction in the image, the observation coefficients can be designed to be ordered in such a manner that the correlations therebetween are spatially close to each other.

Also, when compressing the observation coefficient y, the compression part 23 can generate the predictive value p of the observation coefficient y. Also, the compression part 23 performs compression by calculating the difference between the predictive value p and an actual measurement value (observation coefficient y input to the compression part 23) and encoding the differential value therebetween. Accordingly, this further improves the compression ratio. In this case, the initial coefficient prior to the start of prediction is handled without using a predictive value.

Also, when the compression part 23 compresses the observation coefficients y, it may be preferred to have a configuration that permits switchover between a variable length and a fixed length, i.e., a configuration in which a mode is set to determine whether or not to use the predictive value p so that data may be generated using a variable length when the predictive value p is used and that data may be generated using a fixed length when the predictive value p is not used. It is also possible to have a configuration in which a flag indicating the mode being set is transmitted.

Also, the predictive value p is generated using the adjacent coefficient in the same block, using multiple adjacent coefficients, using multiple adjacent coefficients each multiplied by a weight, or using multiple coefficients each multiplied by a weight that varies depending on the location of the coefficient. Also, the predictive value p is generated using the adjacent coefficients between blocks, using multiple adjacent coefficients, using multiple coefficients each multiplied by a weight, or using multiple adjacent coefficients each multiplied by a weight that varies depending on the location of the coefficient. Furthermore, the predictive value p is generated using adjacent coefficients in the same block or between blocks, or using multiple adjacent coefficients.

Second Embodiment

Next, a second embodiment of the present technology will be given below. In the first embodiment described above, a description has been given using an example in which it is determined whether or not to perform compression on each coefficient y to output the result in a fixed length or a variable length. In the second embodiment, by contrast, it is determined whether or not to carry out compression in units of a block to output all observation coefficients y within the block in a fixed length or a variable length (except for the initial observation coefficient y).

Note that the blocks in this case are those output from the block dividing part 21 (FIG. 1), each of the blocks being constituted by 4×4 pixels, for example.

Figure 15A:
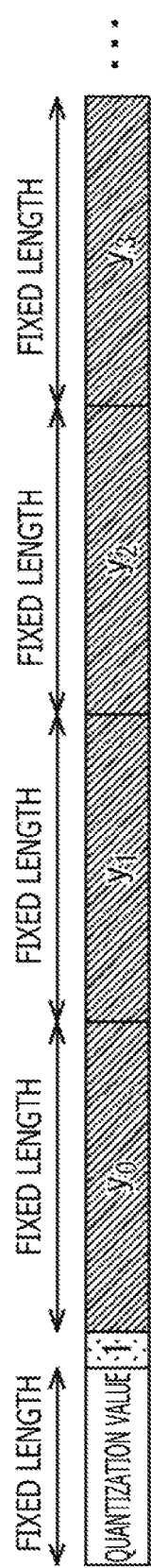
FIGS. 15A and 15B are explanatory diagrams explaining stream configurations.
Figure 15B:
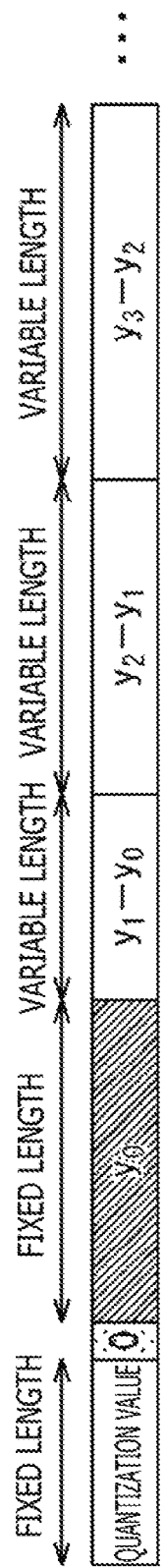

In the second embodiment, the stream such as one illustrated in FIG. 15A or 15B is generated to be output. The stream illustrated in FIG. 15A applies when the observation coefficients are output in units of a block having a fixed length. The stream has a "quantization value" disposed in its head. The quantization value is obtained by having the observation coefficient y within the block quantized.

In the second embodiment, the quantization value used for compressing the observation coefficient y within the block is variable. Depending on the features of the image in the block, a suitable quantization value is set and quantized. Accordingly, information regarding the quantization value acquired by quantizing the observation coefficients y in the block is attached to the head of the stream to be output.

The "quantization value" is followed by the output of information indicating whether the observation coefficient is compressed in the prediction mode or in the non-prediction mode. Also in the second embodiment, as in the case of the first embodiment, the information "0" is set when the prediction mode is in effect and "1" is set when the non-prediction mode is in effect. FIG. 15A illustrates an example in which the information "1" indicating that the non-prediction mode is in effect is set.

Because the observation coefficients y are compressed in the non-prediction mode, the information "1" is followed by the continuous output of the observation coefficients y having a fixed length each. In the example illustrated FIG. 15A, the observation coefficients y0, y1, y2, y3, . . . each having a fixed length are continuously output in a stream.

What is illustrated in FIG. 15B is a stream applicable when the observation coefficients are output in units of a block having a variable length. The stream has the "quantization value" disposed in the head. The quantization value is obtained by having the observation coefficient y within the block quantized.

The "quantization value" is followed by the output of information indicating whether the observation coefficients are compressed in the prediction mode or in the non-prediction mode. Because the stream illustrated in FIG. 15B applies when the prediction mode is in effect, the information "0" is set.

Because the observation coefficients y are compressed with the prediction mode in effect, the observation coefficients y having a variable length each are continuously output following the information "0," except that the initial observation coefficient y alone is output in a fixed length. That is, the example illustrated in FIG. 15A indicates that the output of the observation coefficient y0 having a fixed length is followed by continuous output of the differential values (y1−y0), (y2−y1), (y3−y2), . . . each having a variable length in a stream.

In this manner, the stream is output in units of a block of a fixed length or a variable length. Thus, the compression part 23 is configured as illustrated in FIG. 16.

Figure 16:
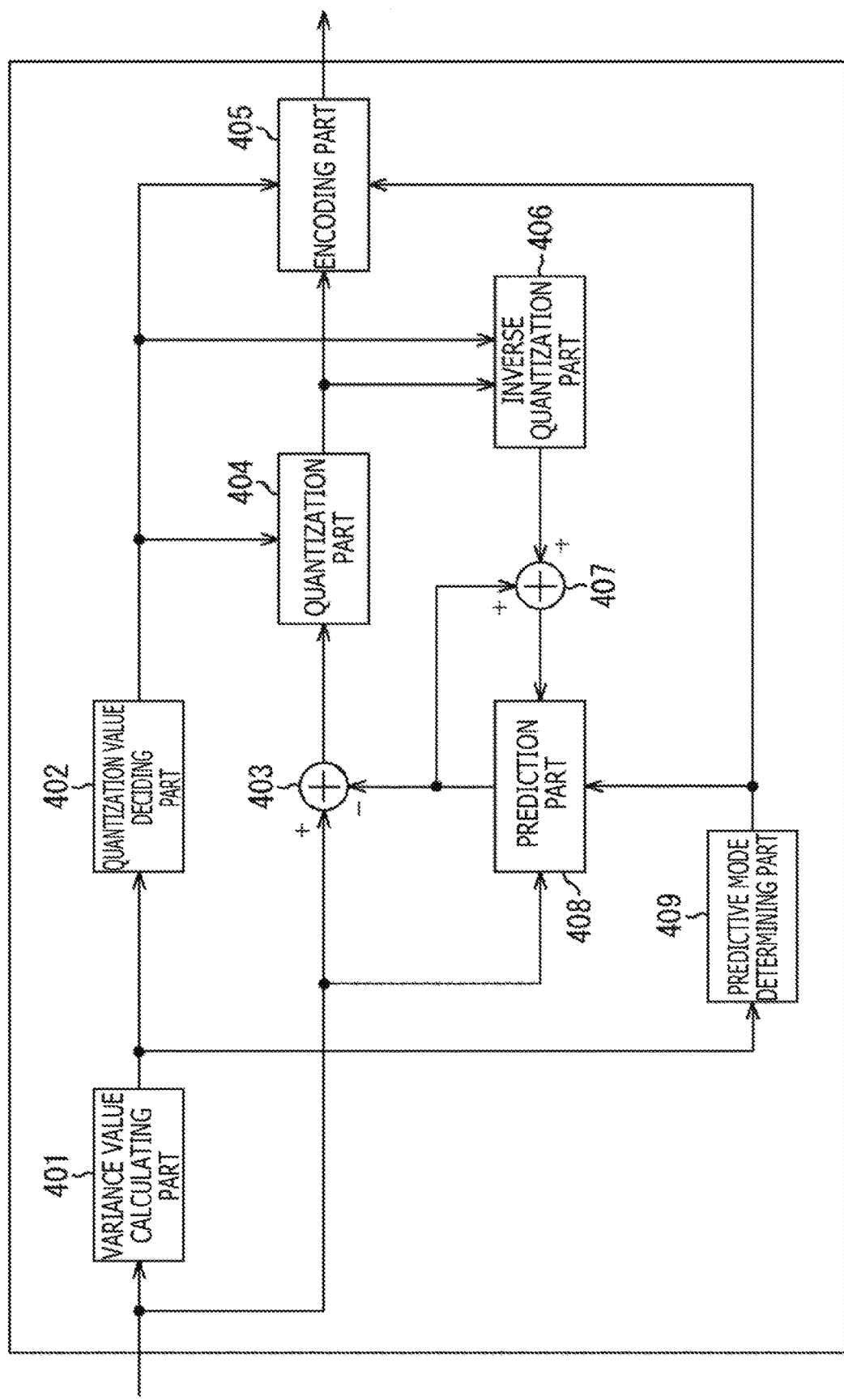
FIG. 16 is an explanatory diagram explaining a configuration of a compression part in a second embodiment of the present technology.

FIG. 16 illustrates a configuration of a compression part 23B in the second embodiment (this compression part is identified by a reference character 23B hereunder to indicate that this compression part belongs to the second embodiment). The compression part 23B includes a variance value calculating part 401, a quantization value deciding part 402, a subtraction part 403, a quantization part 404, an encoding part 405, an inverse quantization part 406, an addition part 407, a prediction part 408, and a predictive mode determining part 409.

In the compression part 23B of the second embodiment, the subtraction part 403, the quantization part 404, the encoding part 405, the inverse quantization part 406, the addition part 407, and the prediction part 408 are configured basically the same as in the compression part 23 of the first embodiment. The operations of the parts 403 to 408 are also basically the same as their counterparts in the first embodiment. Thus, descriptions of the configuration and operations of the parts will be omitted hereunder where appropriate.

The result of random sampling (observation coefficients y) by the random sampling part 22 is input to the compression part 23B. The observation coefficients y input to the compression part 23B are supplied to each of the variance value calculating part 401, the subtraction part 403, and the prediction part 408.

From the input observation coefficients y, the variance value calculating part 401 calculates a variance value indicating a degree of difficulty of encoding. For example, from the observation coefficients y of one block, the variance value calculating part 401 calculates variance of the observation coefficients y such as the differential value between a maximum and a minimum value of the observation coefficients y, regards the differential value as a value indicating a degree of variance of the observation coefficients y, and supplies the value to each of the quantization value deciding part 402 and the predictive mode determining part 409. Incidentally, although the variance value is used here as a typical indicator indicating the degree of difficulty of encoding, suitable indicators other than the variance value may be used alternatively to represent the degree of difficulty of encoding.

Given the variance value from the variance value calculating part 401, the quantization value deciding part 402 decides the quantization value for quantization in the quantization part 404. The quantization value deciding part 402 holds a table 451 such as one illustrated in FIG. 17, and decides the quantization value with reference to the table 451.

In the table 451 illustrated in FIG. 17, variance values are associated with quantization values. For example, when the variance value is equal to or smaller than a threshold value T1, "1" is set as the quantization value in the table 451 (the setting has no quantization). Also, when the variance value is larger than the threshold value T1 and equal to or smaller than a threshold value T2, "2" is set as the quantization value in the table 451 (the setting is made when LSB 1 bit is quantized).

Also, when the variance value is larger than the threshold value T2 and equal to or smaller than a threshold value T3, "4" is set as the quantization value in the table 451 (the setting is made when LSB 2 bits are quantized). Also, when the variance value is larger than the threshold value T3 and equal to or smaller than a threshold value T4, "8" is set as the quantization value in the table 451 (the setting is made when LSB 3 bits are quantized).

Further, when the variance value is larger than the threshold value T4, "16" is set as the quantization value in the table 451 (the setting is made when LSB 4 bits are quantized). The table 451 is thus referenced, and the quantization value corresponding to the variance value is set accordingly. Note that the table 451 is only an example and is not limitative of the present technology. Hence, some other suitable method may be used to set the quantization value.

For example, the settings can be made (in the table 451) in such a manner that more complex-shaped, less visually-conspicuous blocks to human eyes have their variance values, quantization values, and compression ratios set to be larger and that flat images have their variance values and quantization values set to be smaller. In this manner, subjective image quality can be improved.

The quantization value decided by the quantization value deciding part 402 is supplied to each of the quantization part 404, the encoding part 405, and the inverse quantization part 406.

Using the quantization value decided by the quantization value deciding part 402, the quantization part 404 quantizes the differential value between the observation coefficient from the subtraction part 403 and the predictive value, and outputs the quantized differential value to the encoding part 405. The encoding part 405 encodes the input differential value using a predetermined encoding method such as Huffman coding, and outputs the result as a stream. The stream is output from the encoding part 405 as described above with reference to FIGS. 15A and 15B.

The output from the variance value calculating part 401 is also supplied to the predictive mode determining part 409. From the variance value, the predictive mode determining part 409 determines whether the prediction mode or the non-prediction is to be set. The prediction mode is a mode in which the predictive value is used and the differential value is compressed to a variable length.

The predictive mode determining part 409 compares a predetermined threshold value (e.g., threshold value T11) with the variance value to set either the prediction mode (variable-length mode) or the non-prediction mode (fixed-length mode). For example, when the variance value is equal to or larger than the threshold value T11, the fixed-length mode is set. When the variance value is equal to or smaller than the threshold value T11, the variable-length mode is set. In a case where the variance value is equal to the threshold value T11, either the fixed-length mode or the variable-length mode may be set.

In a case where the variance value is equal to or larger than the threshold value T11, there is a high possibility that the observation coefficients y are dispersed and that the differential value therebetween tends to be larger. The larger the differential value, the lower the compression ratio that results when the differential value is compressed (encoded). Thus, in the case where the variance value is equal to or larger than the threshold value T11, the fixed-length mode is set. Meanwhile, in the case where the variance value is equal to or smaller than the threshold value T11, the possibility that the observation coefficients y are dispersed is low, and the differential value tends to be small. When the differential value is small and is compressed (encoded), there is a high possibility that the compression ratio becomes high. Thus, in the case where the variance value is equal to or smaller than the threshold value T11, the variable-length mode is set.

The result of determination by the predictive mode determining part 409 is supplied to each of the prediction part 408 and the encoding part 405. In the case where the fixed-length mode is set by the predictive mode determining part 409, "1" is supplied to each of the prediction part 408 and the encoding part 405. In the case where the variable-length mode is set, "0" is supplied to each of the prediction part 408 and the encoding part 405. The information (0 or 1) regarding this mode in effect is included in the stream and supplied to the decoding side, as described above with reference to FIGS. 15A and 15B.

In the case where the prediction mode (variable-length mode) is set, the prediction part 408 generates the predictive value and supplies it to the subtraction part 403. For example, the prediction part 408 may operate in the same manner as the prediction part 204 in the compression part 23 illustrated in FIG. 10 and may be configured as illustrated in FIG. 11. However, the predictive mode, supplied from the predictive mode determining part 409, is not needed in the configuration of the prediction part 408.

Note that the predictive mode determining part 409 may be included in the prediction part 408. The internal configuration of the prediction part 408 may be made basically the same as that of the prediction part 204 illustrated in FIG. 11.

The processes performed in the subtraction part 403, the quantization part 404, the encoding part 405, the inverse quantization part 406, the addition part 407, and the prediction part 408 are basically the same as those carried out in the subtraction part 201, the quantization part 211, the encoding part 202, the inverse quantization part 212, the addition part 203, and the prediction part 204 in FIG. 10, and thus, descriptions thereof will be omitted here.

However, the quantization part 404 and the inverse quantization part 406 differ from their counterparts in FIG. 10 in that the quantization part 404 and the inverse quantization part 406 perform quantization and inverse quantization, respectively, using the quantization value decided by the quantization value deciding part 402.

In this manner, according to the second embodiment, a suitable quantization value is set for each block, and quantization is performed. For example, it is possible to adjust the quantization value for the observation coefficients y reflecting the subjective conspicuousness of errors. Also, because the quantization value is set to be varied from one block to another, the quantization values obtained by quantizing the observation coefficients y are included in the stream.

Furthermore, the prediction method (the fixed-length mode or the variable-length mode) can be set for each block. Also, with the prediction method set for each block, the stream includes a flag indicating the prediction method applicable when the observation coefficients y are compressed.

Third Embodiment

Next, a third embodiment of the present technology will be described below. The third embodiment involves dividing a band into a high-frequency component and a low-frequency component. Different types of compression are performed on these components.

FIG. 18 illustrates a configuration of a data processing apparatus 10C according to the third embodiment of the present technology (this data processing apparatus is identified by a reference character 10C hereunder to indicate that this apparatus is the third embodiment). Note that the parts substantially the same as those in the data processing apparatus 10 of the first embodiment illustrated in FIG. 1 are identified by the same reference numerals, and descriptions thereof will be omitted where redundant.

The data processing apparatus 10C includes an image sensor 20, a block dividing part 21, a band dividing part 501, a low-frequency component compressing part 502, a recording part 503, a low-frequency component decoding part 504, a band synthesizing part 505, a block synthesizing part 30, a random sampling part 511, a CS data compressing part 512, a recording part 513, a CS data decoding part 514, a sparse coefficient converting part 515, an image reconstructing part 516, a sampling matrix holding part 517, a sampling matrix calculating part 518, and a sparse coefficient matrix holding part 519.

The basic configuration of the data processing apparatus 10C is that of the data processing apparatus 10 according to the first embodiment to which the band dividing part 501, the low-frequency component compressing part 502, the recording part 503, the low-frequency component decoding part 504, and the band synthesizing part 505 are added. The added parts compress the low-frequency component.

The random sampling part 511, the CS data compressing part 512, the recording part 513, the CS data decoding part 514, the sparse coefficient converting part 515, the image reconstructing part 516, the sampling matrix holding part 517, the sampling matrix calculating part 518, and the sparse coefficient matrix holding part 519 in the data processing apparatus 10C correspond respectively to the random sampling part 22, the compression part 23, the recording part 24, the decoding part 27, the sparse coefficient converting part 28, the image reconstructing part 29, the sampling matrix holding part 25, the sampling matrix calculating part 26, and the sparse coefficient matrix holding part 31 in the data processing apparatus 10 of the first embodiment. These parts compress the high-frequency component.

The data processing apparatus 10C of the third embodiment compresses the low-frequency component through a common compression method and compresses the high-frequency component through compressed sensing. When the low-frequency and the high-frequency components are compressed by different compression methods, the respective components are optimally compressed, and the compression ratio can be further improved.

The image data of the image captured by the image sensor 20 in the data processing apparatus 10C is supplied to the block dividing part 21. The block dividing part 21 divides the image data (image) from the image sensor 20 into unit processing blocks and supplies the divided processing blocks one by one to the band dividing part 501. The band dividing part 501 divides the pixels in each block into low-frequency component pixels and high-frequency component pixels. The band dividing part 501 supplies the low-frequency component pixels (image data) to the low-frequency component compressing part 502 and the high-frequency component pixels (image data) to the random sampling part 511.

Herein, how the band dividing part 501 performs band division will be described below with reference to FIGS. 19A, 19B, 19C, 19D, and 19E. FIGS. 19A 19B 19C, 19D, and 19E are used here to explain that 8×8 pixels making up 16 pixels constitute one block and that the block is divided into a low-frequency component and a high-frequency component when subjected to band division. In FIGS. 19A, 19B, 19C, 19D, and 19E, the shaded pixels are handled as the low-frequency component pixels and those not shaded are treated as the high-frequency component pixels.

In an example illustrated in FIG. 19A, one horizontal row of pixels including the one in the top left position (DC component pixel) and one vertical column of pixels including the one in the top left position are handled as the low-frequency component, and the other pixels are treated as the high-frequency component. The example illustrated in FIG. 19A indicates that the low-frequency component pixels are set symmetrically in the horizontal and vertical directions.

In an example illustrated in FIG. 19B, only the pixel in the top left position (DC component pixel) is handled as the low-frequency component, and the other pixels are treated as the high-frequency component.

In an example illustrated in C in FIG. 19C, 3×3 DC component pixels making up 9 pixels in the top left corner are handled as the low-frequency component, and the other pixels are treated as the high-frequency component.

In an example illustrated in FIG. 19D, one horizontal row of pixels including the one in the top left position (DC component pixel) and one vertical column of 5 pixels including the one in the top left position are handled as the low-frequency component, and the other pixels are treated as the high-frequency component. The example illustrated in FIG. 19D indicates that the low-frequency component pixels are set asymmetrically in the horizontal and vertical directions.

In an example illustrated in FIG. 19E, either one horizontal row of pixels including the one in the top left position (DC component pixel) or one vertical column of pixels including the one in the top left position (DC component pixel) is selected as the low-frequency component depending on predetermined conditions. As a result, the pixels other than those selected as the low-frequency component are handled as the high-frequency component.

Using one of the methods illustrated in FIGS. 19A, 19B, 19C, 19D, and 19E or some other suitable method not illustrated herein, the band dividing part 501 divides the pixels in each of the unit processing blocks divided by the block dividing part 21 into the low-frequency and high-frequency component pixels. The band dividing part 501 outputs the low-frequency component pixels to the low-frequency component compressing part 502 and the high-frequency component pixels to the random sampling part 511.

The low-frequency component compressing part 502 compresses the low-frequency component pixels by a predetermined compression method and records the result of compression to the recording part 503. The compression is performed by the low-frequency component compressing part 502 using a common compression method. For example, one such method may involve calculating the differential value between adjacent pixels and encoding the calculated differential values. Another method may involve calculating the differential value between the pixels in the same position between adjacent blocks and encoding the calculating differential values.

The recording part 503 records compressed low-frequency component pixels. The low-frequency component decoding part 504 reads the compressed low-frequency component pixels recorded in the recording part 503, decodes the pixels using a decoding method corresponding to the compression method used by the low-frequency component compressing part 502, and outputs the result of decoding to the band synthesizing part 505.

The band synthesizing part 505 performs the process reverse to the one carried out by the band dividing part 501. In so doing, the band synthesizing part 505 synthesizes the low-frequency and high-frequency component pixels into an image of one block and outputs the synthesized image to the block synthesizing part 30.

Meanwhile, the random sampling part 511 is supplied with the image data in an image region handled as the high-frequency component of a unit processing block from the band dividing part 501, and with the sampling matrix from the sampling matrix holding part 517. As in the first embodiment, the sampling matrix held in the sampling matrix holding part 517 has been optimized for compression by the CS data compressing part 512.

The random sampling part 511 randomly samples the high-frequency component pixels using the sampling matrix to generate the observation coefficients y and outputs the generated observation coefficients to the CS data compressing part 512. The CS data compressing part 512 performs compression in the same manner as the compression part 23 (FIG. 1) of the first embodiment. The data compressed by the CS data compressing part 512 is recorded in the recording part 513. The data recorded in the recording part 513 is read and decoded by the CS data decoding part 514.

The CS data decoding part 514 performs decoding corresponding to the compression carried out by the CS data compressing part 512, and outputs the decoded data to the sparse coefficient converting part 515. The sparse coefficient converting part 515 generates the data yet to be randomly sampled by the random sampling part 511, using the sparse coefficient matrix held by the sparse coefficient matrix holding part 519 and the sampling matrix held by the sampling matrix holding part 517. The sparse coefficient converting part 515 carries out its processing in the same manner as the sparse coefficient converting part 28 (FIG. 1) in the first embodiment.

However, the sparse coefficient matrix held by the sparse coefficient matrix holding part 519 is optimized for high-frequency component pixels, as with the sampling matrix held by the sampling matrix holding part 517. The sparse coefficient matrix held by the sparse coefficient matrix holding part 519 is learned before being held and is optimized for the high-frequency component pixels. For example, a learning apparatus such as one illustrated in FIG. 20 is used to perform the learning.

Figure 20:
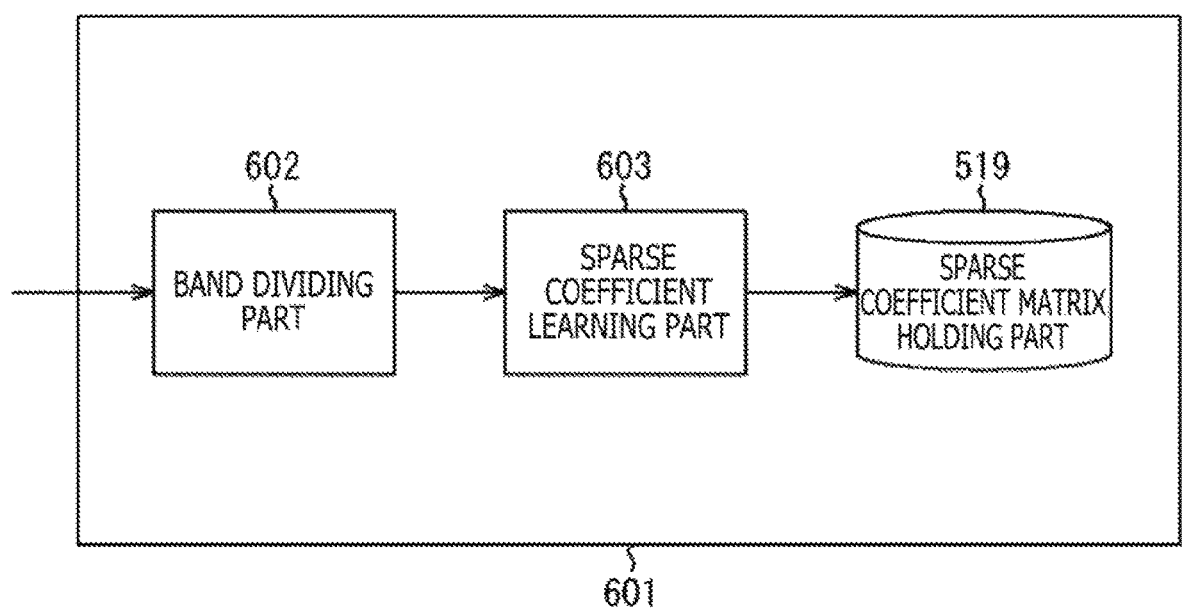
FIG. 20 is a schematic diagram illustrating a configuration example of an apparatus that learns a sparse coefficient matrix.

A learning apparatus 601 illustrated in FIG. 20 includes a band dividing part 602, a sparse coefficient learning part 603, and a sparse coefficient matrix holding part 519. As with the band dividing part 501 illustrated in FIG. 18, the band dividing part 602 receives input of an image (i.e., image divided into blocks) and divides the input image into a low-frequency component and a high-frequency component.

Of the images divided in bandwidth by the band dividing part 602, the pixels divided into the high-frequency component are supplied to the sparse coefficient learning part 603. The sparse coefficient learning part 603 performs learning targeted for high-frequency component pixels to generate a sparse coefficient matrix $\varphi$ and causes the sparse coefficient matrix holding part 519 to hold the generated sparse coefficient matrix. Thus, the learning targeted for high-frequency component pixels is performed to generate the sparse coefficient matrix $\varphi$ dedicated to the high-frequency component pixels.

Incidentally, as will be described later with reference to FIG. 21, in the case where frequency-converted image data is divided in bandwidth for treatment of the divided image data, the frequency-converted image data also needs to be used at the time of learning the sparse coefficient matrix. Thus, the learning apparatus 601 is configured in such a manner that a frequency converting part, not illustrated, is provided in the former stage of the band dividing part 602, so that the image data frequency-converted by the frequency converting part is input to the band dividing part 602.

The sparse coefficient from the sparse coefficient converting part 515 (FIG. 18) is supplied to the image reconstructing part 516. The image reconstructing part 516 converts the supplied sparse coefficient into a high-frequency component image and outputs the resulting image to the band synthesizing part 505. The band synthesizing part 505 synthesizes the supplied low-frequency and high-frequency component images to restore an image of one block, and outputs the restored image to the block synthesizing part 30. The block synthesizing part 30 synthesizes the images of the blocks into the image of the original size.

Data compression is performed separately on the low-frequency component and the high-frequency component in this manner, and accordingly, it becomes possible to perform both the compression optimized for the low-frequency component and the compression optimized for the high-frequency component. Hence, this makes it possible to further improve the compression ratio.

Figure 21:
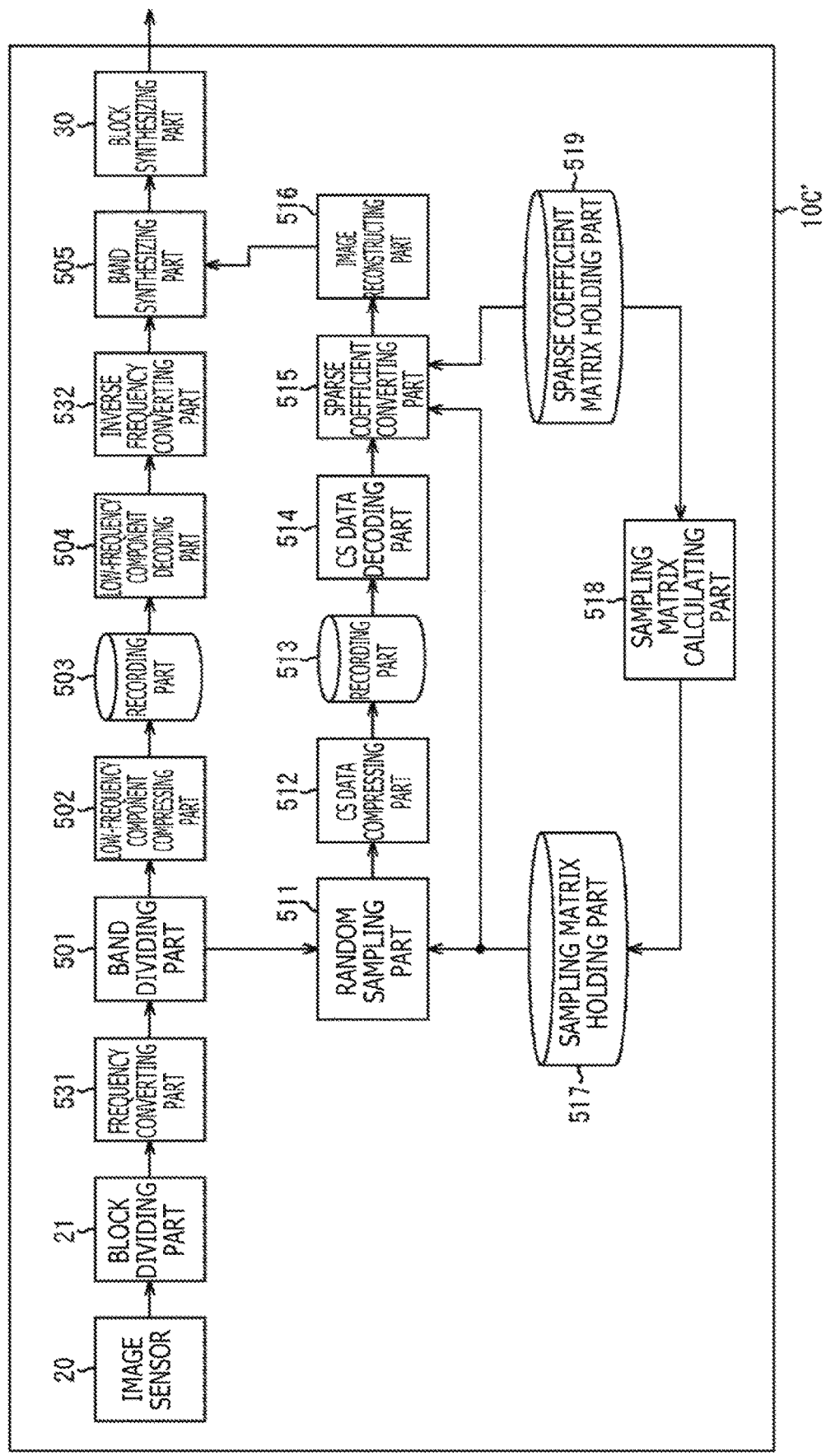
FIG. 21 is a schematic diagram illustrating another configuration of the data processing apparatus in the third embodiment.

FIG. 21 illustrates another configuration of the data processing apparatus 10C according to the third embodiment. A data processing apparatus 10C' illustrated in FIG. 21 (this data processing apparatus is identified by primed reference character 10C' hereunder for distinction from the data processing apparatus 10C illustrated in FIG. 18) is configured the same as the data processing apparatus 10C illustrated in FIG. 18 except that a frequency converting part 531 and an inverse frequency converting part 532 are added. The parts substantially the same as those in the data processing apparatus 10C are identified by the same reference characters, and their explanations are omitted where redundant.

The frequency converting part 531 receives input of the image divided into unit blocks by the block dividing part 21, and converts the input image into frequency component images using a frequency conversion method such as discrete cosine transform (DCT) or wavelet. The band dividing part 501 performs the process of dividing the frequency-converted image into a low-frequency component image and a high-frequency component image.

The inverse frequency converting part 532 performs the process of inverse frequency conversion on the low-frequency component image data decoded by the low-frequency component decoding part 504, the inverse frequency converting process corresponding to the frequency converting process carried out by the frequency converting part 531. As a result, the inverse frequency converting part 532 restores the frequency component image data into the image data yet to be frequency-converted (low-frequency component image data), and outputs the resulting data to the band synthesizing part 505.

As described above, the data processing apparatus may be configured to have frequency conversion accomplished prior to the band division of image data into low-frequency and high-frequency components.

The data processing apparatus 10C' illustrated in FIG. 21, as with the data processing apparatus 10C illustrated in FIG. 18, performs compression separately on the low-frequency component and on the high-frequency component. The low-frequency and the high-frequency components are thus compressed in a manner optimized for the respective components. This further improves the compression ratio.

The data processing apparatus 10C illustrated in FIG. 18, as well as the data processing apparatus 10C' illustrated in FIG. 21, divides the image into the low-frequency and high-frequency components for processing. As described above with reference to FIG. 19, in a case where the image is divided into the low-frequency and high-frequency components in accordance with the pixel positions, i.e., where the positions and the quantities of high-frequency component pixels are the same and where the range of the high-frequency component pixels has the same shape, the sampling matrix suitable for the shape may be generated and utilized.

The sampling matrix, as described above with reference to FIG. 6 for example, is a matrix which, when schematically presented two-dimensionally, has 0 or 1 applied to the pixels in predetermined positions within the block targeted for random sampling processing. FIG. 6 illustrates typical matrices each being a rectangular block of 4×4 pixels amounting to 16 pixels. The sampling matrices of these shapes apply to the case where the block divided into the high-frequency component is a rectangular block of 4×4 pixels constituting 16 pixels.

For example, suppose that, as illustrated in FIG. 19B, the sampling matrix for 8×8 pixels amounting to 64 pixels is applied to a 63-pixel block resulting from the block of 8×8 pixels constituting 64 pixels minus one pixel in the top left position. In such a case, the excluded pixel in the top left position may affect the result of random sampling (observation coefficient y).

The data processing part 10C' illustrated in FIGS. 22A and 22B includes the frequency converting part 531 that converts the image in frequency prior to division into low-frequency and high-frequency components. Thus, there is a possibility that the image divided into the high-frequency component can change in shape from one block to another. This requires that a suitable sampling matrix be used to match the change.

In view of this, there may be provided a scheme in which the sampling matrix is changed as needed, as described hereunder with reference to FIGS. 22A and 22B. A in FIG. 22A illustrates one block being divided in bandwidth by the band dividing part 501. For purpose of explanation, FIG. 22A gives an example in which 8×8 pixels constituting 64 pixels are handled as one block.

In FIG. 22A, the shaded pixels are categorized as low-frequency component pixels. In the example of FIG. 22A, the pixels categorized as the low-frequency component make up one horizontal row of pixels including the DC component pixel in the top left position and one vertical column of pixels excluding the pixel in the bottom position.

For example, the sampling matrix holding part 517 may hold a sampling matrix targeted for a rectangular block of 8×8 pixels amounting to 64 pixels. When the random sampling part 511 performs random sampling, the positions of the pixels categorized as the low-frequency component are converted to 0 set in the sampling matrix before the pixels are used.

In a case where the pixels are categorized into the low-frequency and high-frequency components as illustrated in FIG. 22A, the sampling matrix to be applied to the low-frequency component pixels has 0 set for the low-frequency component pixels, as illustrated in FIG. 22B. In the sampling matrix illustrated in FIG. 22B, the hatched pixels are the pixels categorized as the high-frequency component pixels. This portion constitutes a matrix of which the elements are values each ranging from 0 to 1 (0 or 1), as in the case of the first embodiment.

In that case, the sparse coefficient matrix is calculated by the cost expression (31) below. In the expression (31), D denotes the conversion coefficient such as a DCT coefficient used for frequency conversion.

[Math. 31]

$$\min_{z} \|y - DA\phi z\|_2^2 + \lambda \|z\|_1, \lambda > 0 \tag{31}$$

FIG. 23 illustrates a configuration of a data processing apparatus 10C" as the third embodiment. The configuration of the data processing apparatus 10C" illustrated in FIG. 23 is the same as that of the data processing apparatus 10C' illustrated in FIG. 21 to which an inverse frequency converting part 571 is added.

In the data processing apparatus 10C" illustrated in FIG. 23, random sampling is performed after the conversion from frequency domain image data to image domain data is performed. That is, the frequency-converted high-frequency component image data output from the band dividing part 501 is supplied to the inverse frequency converting part 571. In turn, the inverse frequency converting part 571 performs the process of inverse frequency conversion on the supplied data for conversion into the pixel domain image data.

Thereafter, the random sampling part 511 carries out random sampling. In this case, the same process of random sampling as that of the first embodiment, for example, is performed on the pixel domain image data. However, as in the case of the third embodiment, it is the pixels categorized as the high-frequency component that are targeted for sampling.

The third embodiment, as described above, divides the image into components (low-frequency and high-frequency components) and performs different processes on the respective components for image compression. Thus, this makes it possible to optimally process each of the different image components, so that the efficiency of data compression is further improved. Also, for example, a common image compression method may be applied to the low-frequency component. Also, for example, compressed sensing may be applied to the high-frequency component.

In addition, any one of diverse methods may be applied to dividing the image into the components. Also, because the sampling matrix and the sparse coefficient matrix can be optimized for the high-frequency component, compressed sensing can be carried out in a manner more optimally suited for the high-frequency component.

Fourth Embodiment

Figure 24:
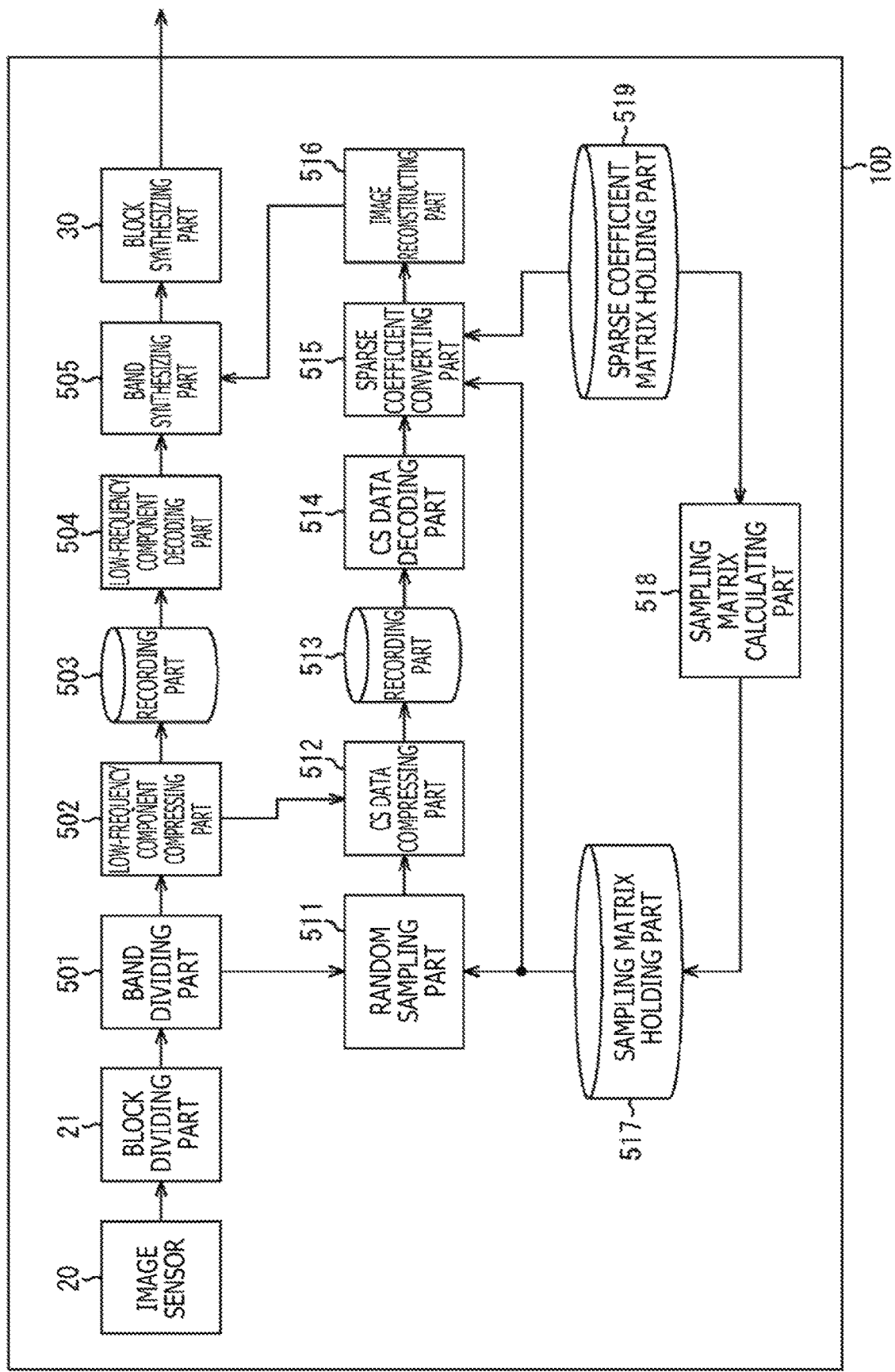
FIG. 24 is a schematic diagram illustrating a configuration of a data processing apparatus of a fourth embodiment of the present technology.

Next, a fourth embodiment of the present technology will be described below. FIG. 24 illustrates a configuration of a data processing apparatus 10D as the fourth embodiment of the present technology. The data processing apparatus 10D illustrated in FIG. 24 is configured the same as the data processing apparatus 10C illustrated in FIG. 18, except that the low-frequency component compressing part 502 supplies the CS data compressing part 512 with information regarding the bit length applicable to the low-frequency component compressing part 502.

A description will be given herein using, as an example, a case in which the fourth embodiment is applied to the data processing apparatus 10C illustrated in FIG. 18. Alternatively, the scheme of the fourth embodiment may be also applied to the data processing apparatus 10C' illustrated in FIG. 21 or to the data processing apparatus 10C" illustrated in FIG. 23.

The data processing apparatus 10D of the fourth embodiment can perform compression in such a manner that a block in a particular location within the image can referenced instantaneously. This feature will be described below with reference to FIGS. 25A and 25B.

Figure 25A:
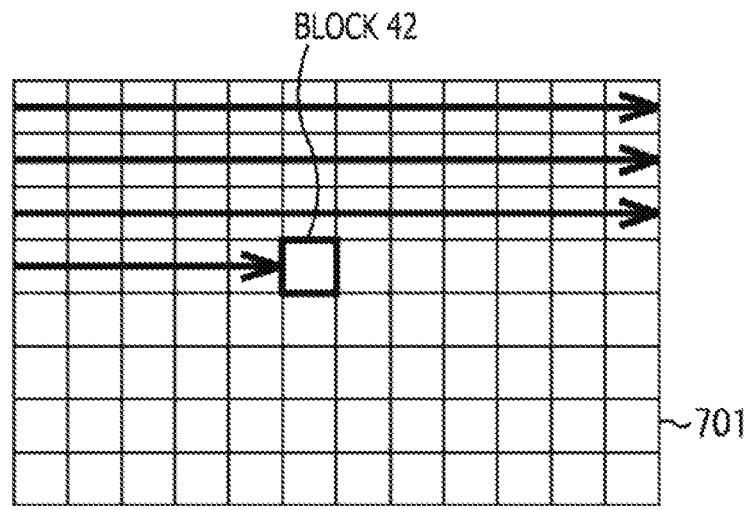
FIGS. 25A and 25B are explanatory diagrams explaining how a block is read out.
Figure 26:
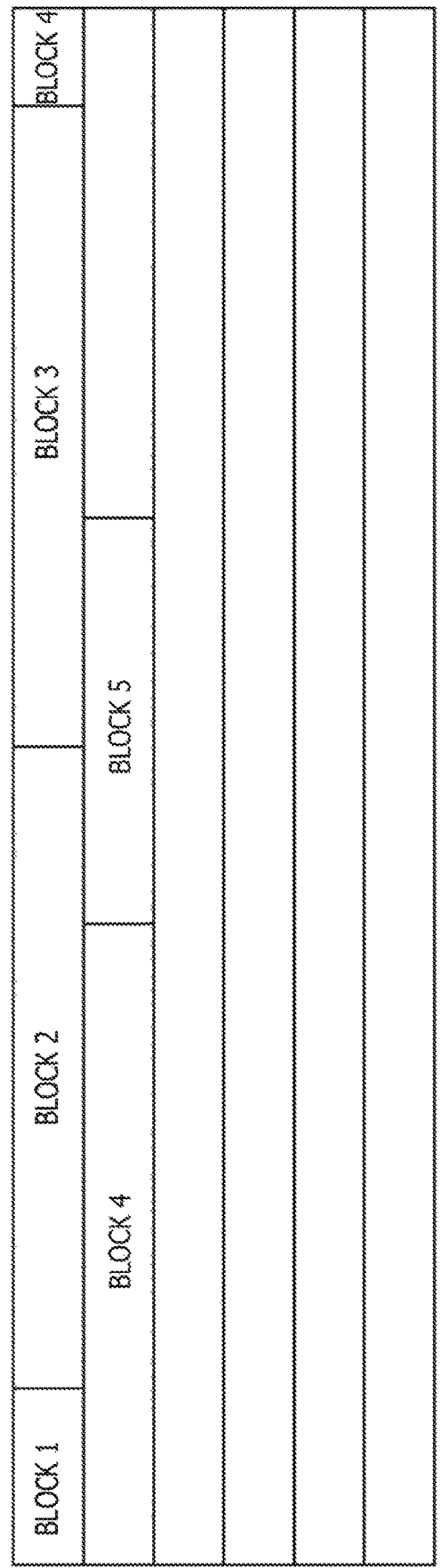
FIG. 26 is a schematic diagram illustrating an image of a memory map for variable length compression.

A in FIG. 25A indicates a state where an image 701 is divided into unit blocks. As illustrated in FIG. 26, the image 701 has the image data of each of its blocks compressed to a variable length. Thus, a block 1, a block 2, a block 3, a block 4, a block 5, . . . each have a different data amount.

For example, suppose that a block 42, i.e., the 42nd block in the image 701, is desired to be accessed. To gain access to the block 42 requires successively accessing each of the blocks preceding the 42nd block in the order starting from the block 1 until the target block is reached. An alternative method may involve preparing a table in which a start position of each of the blocks is recorded, and getting the table referenced to access the start position of the block 42.

As described, in the case where the blocks have a variable block size when encoded, it is difficult to directly access the start position of the block 42.

Figure 25B:
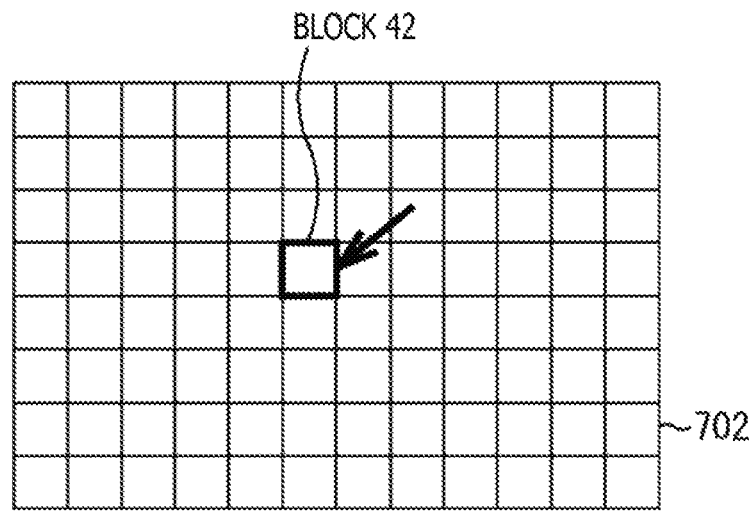
Figure 27:
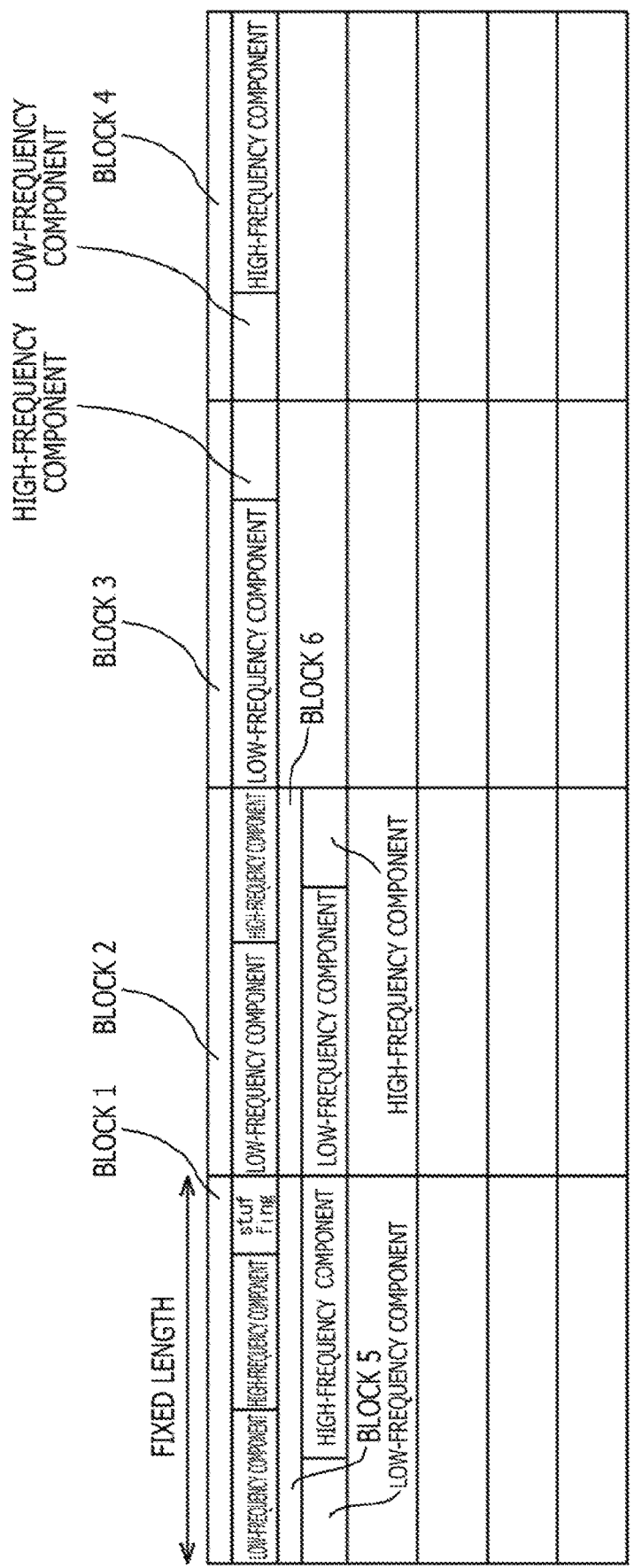
FIG. 27 is a schematic diagram illustrating another image of the memory map for variable length compression.

FIG. 25B illustrates a state where an image 702 is divided into unit blocks. In the image 702, the image data of each of the blocks is compressed to a fixed length as illustrated in FIG. 27. The block 1, the block 2, the block 3, the block 4, the block 5, . . . have the same data amount because these blocks are each compressed to a fixed length.

For example, suppose that the block 42, i.e., the 42nd block in the image 702, is desired to be accessed. In the case of fixed-length compression, the data size of each compressed data is the same regardless of the image 702. This permits easy identification of the division positions (block start positions) of the block data. In this case, it is also possible to directly access the block 42.

For example, in a case where each block has a fixed length of 10 bits, the start position of the block 42 is identified as the 421st bit, so that the bits ranging from the 421st bit to the 430th bit are read out as the data of the block 42. Thus, it is possible to easily retrieve the data, for example, of the block 42 when the image within the block 42 is desired to be extracted from the image 702.

The data processing apparatus 10D of the fourth embodiment compresses the image data of each block to a fixed length. That is, the data processing apparatus 10D generates the stream such as one illustrated in FIG. 27.

Referring again to FIG. 27, each of the blocks is constituted by low-frequency component data and high-frequency component data. In a case where the low-frequency component data and the high-frequency component data are not sufficient to fulfill the fixed bit length set for each block, stuffing data is added to the block.

For example, the block 1 is constituted by low-frequency component data, high-frequency component data, and stuffing data. The block 2 is made of low-frequency component data and high-frequency component data, the low-frequency component data having a longer bit length than the high-frequency component data. The block 3, as in the case of the block 2, is also formed by low-frequency component data and high-frequency component data, the low-frequency component data having a longer bit length than the high-frequency component data.

The block 4 is constituted by low-frequency component data and high-frequency component data, the low-frequency component data having a shorter bit length than the high-frequency component data. The block 5 is constituted by solely low-frequency component data.

As described above, although each of the blocks has a fixed length, a proportion between the low-frequency component data and the high-frequency component data per block varies from one block to another. A stream of blocks of this type which have a fixed length each and in which the proportion between the low-frequency component data and the high-frequency component data varies is generated using the configuration such as that of the data processing apparatus 10D (FIG. 24).

In the data processing apparatus 10D illustrated in FIG. 24, the low-frequency component compressing part 502 compresses the low-frequency component data to such an extent that image quality can be maintained. As a result of this, the low-frequency component compressing part 502 outputs the bit length of the compressed low-frequency component to the CS data compressing part 512.

The CS data compressing part 512 compresses the high-frequency component data (i.e., randomly sampled data) to at least a bit length obtained by subtracting from the bit length per block the bit length coming from the low-frequency component compressing part 502 (the bit length will be referred to as the target bit length hereunder where appropriate).

For example, the CS data compressing part 512 includes the quantization part 211, as in the case of the compression part 23 in FIG. 10. In carrying out quantization, the quantization part 211 has the quantization value set corresponding to the target bit length.

As described above, the low-frequency component compressing part 502 and the CS data compressing part 512 perform their compression processes separately and in such a manner that the data of each block is compressed to a bit length that is set as the data length of one block.

The data processing apparatus 10D performs the above-described processing to generate the stream in which each block has a fixed length as illustrated in FIG. 27. It is thus possible to generate the stream in which a predetermined block in the image is instantaneously accessed.

Note that, in the fourth embodiment, the bit length used for compression by the low-frequency component compressing part 502 is output to the CS data compressing part 512. For this reason, the low-frequency component compressing part 502 does not reference the data of the adjacent block in carrying out compression; the low-frequency component compressing part 502 performs its compression process based on intra-block prediction only.

As described above, in the fourth embodiment, the low-frequency component and the high-frequency component are separately compressed in a manner of keeping the bit length of each block to a fixed length. This makes it possible to generate the stream that can be randomly accessed.

<Recording Media>

A series of processes described above may be executed either by hardware or by software. In a case where the series of processes is to be carried out by software, the programs constituting the software are installed into a suitable computer. Variations of the computer include one with the software installed beforehand in its dedicated hardware, and a general-purpose personal computer or other equipment capable of executing diverse functions with the programs installed therein.

Figure 28:
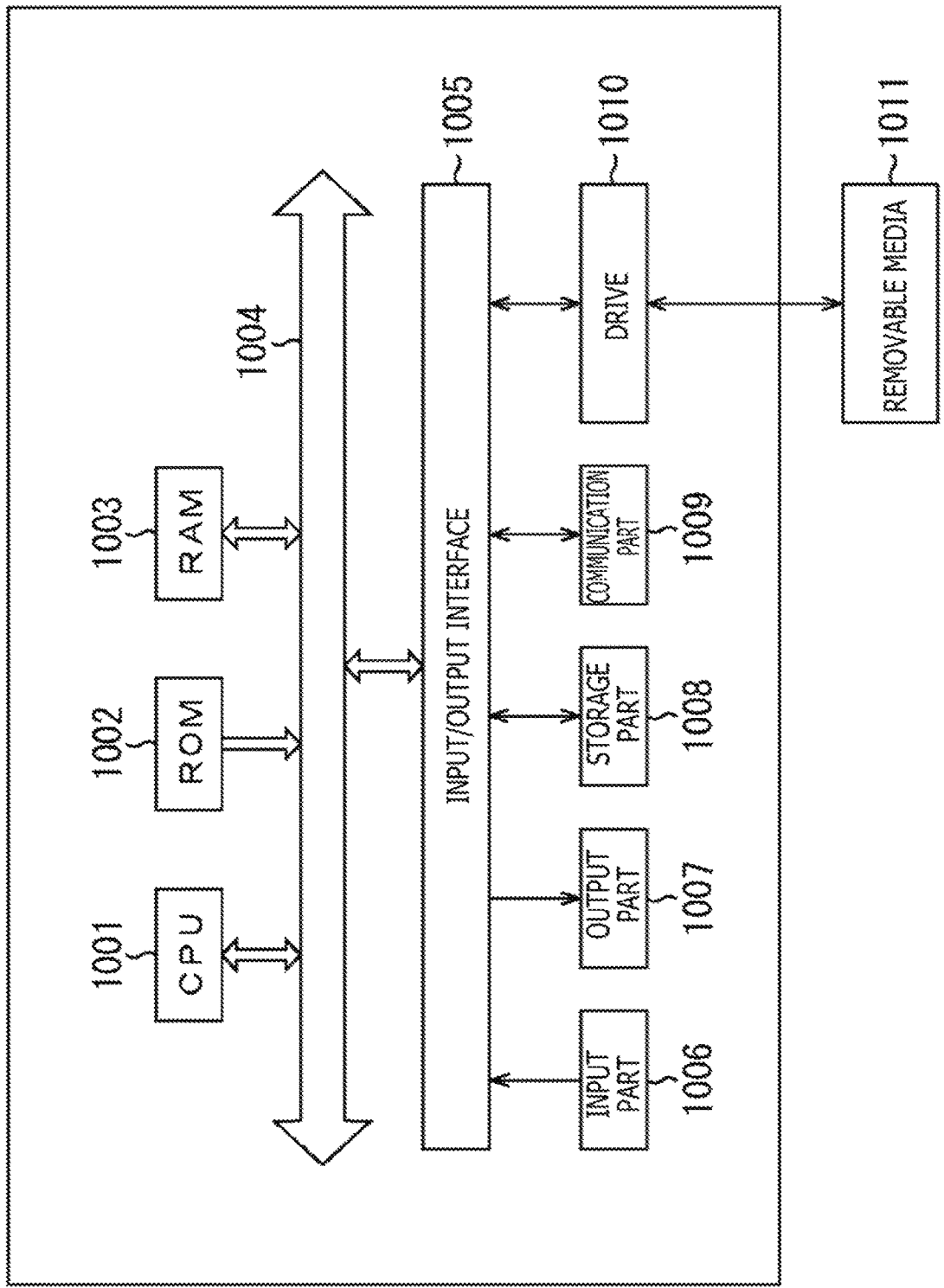
FIG. 28 is an explanatory diagram explaining recording media.

FIG. 28 is a block diagram illustrating a hardware configuration example of a computer that executes the above-described series of processes using programs. In this computer, a central processing unit (CPU) 1001, a read-only memory (ROM) 1002, and a random access memory (RAM) 1003 are interconnected via a bus 1004. The bus 1004 is further connected with an input/output interface 1005. The input/output interface 1005 is connected with an input part 1006, an output part 1007, a storage part 1008, a communication part 1009, and a drive 1010.

The input part 1006 includes a keyboard, a mouse, a microphone, and the like. The output part 1007 includes a display, a speaker, and the like. The storage part 1008 includes a hard disk, a nonvolatile memory, and the like. The communication part 1009 includes a network interface and the like. The drive 1010 drives removable media 1011 such as a magnetic disk, an optical disk, a magneto-optical disk, or a semiconductor memory.

In the computer configured as described above, the CPU 1001 performs the above-mentioned series of processes by loading appropriate programs stored in the storage part 1008 into the RAM 1003 via the input/output interface 1005 and the bus 1004 and by executing the loaded programs.

The programs to be executed by the computer (CPU 1001) may be recorded on, for example, the removable media 1011 such as packaged media to be offered. The programs may also be offered via wired or wireless transmission media such as local area network, the Internet, and digital satellite broadcasting.

In the computer, the programs may be installed into the storage part 1008 from the removable media 1011 attached to the drive 1010 via the input/output interface 1005. The programs may also be installed into the storage part 1008 after being received by the communication part 1009 via wired or wireless transmission media. The programs may alternatively be preinstalled in the ROM 1002 or in the storage part 1008.

Note that each program to be executed by the computer may be processed chronologically, i.e., in the sequence described in this specification; in parallel with other programs, or in otherwise appropriately timed fashion such as when it is invoked as needed.

Also, in this specification, the term "system" refers to an entire apparatus made up of multiple apparatuses.

Note that the advantageous effects stated in this specification are only examples and are not limitative of the present technology. There may be other advantageous effects derived from and not covered by this specification.

Note that the embodiments of the present technology are not limited to the embodiments described above and may be may be modified in various ways within a scope not deviating from the gist of the present technology.

Note that the technology may be also configured as follows:

(1)

A data processing apparatus including:

a first compression part compressing data by compressed sensing; and a second compression part compressing observation coefficients from the first compression part using a compression method different from the method used in the first compression part.

(2)

The data processing apparatus stated in the paragraph (1) above, in which the second compression part calculates a differential value between the observation coefficient from the first compression part and a predictive value, and compresses the differential value.

(3)

The data processing apparatus stated in the paragraph (2) above, in which the first compression part performs random sampling using a sampling matrix, and the sampling matrix is optimized for compression in the second compression part.

(4)

The data processing apparatus stated in the paragraph (3) above, in which the sampling matrix is designed to minimize the differential value.

(5)

The data processing apparatus stated in the paragraph (3) above, in which the data compressed by the first compression part is image data, and the sampling matrix is designed in such a manner that the observation coefficients are arrayed in descending order of spatial correlations in an image.

(6)

The data processing apparatus stated in the paragraph (3) above, in which the sampling matrix is generated in such a manner as to satisfy a restricted isometry property (RIP) condition and a requirement that row vectors of the sampling matrix and column vectors of a sparse coefficient matrix be incoherent, and the sampling matrix is generated in such a manner that the row vectors of the generated sampling matrix are sorted to have the observation coefficients arranged in descending order of spatial correlations in an image.

(7)

The data processing apparatus stated in any of the paragraphs (1) to (6) above, in which the second compression part includes an encoding part encoding the observation coefficient.

(8)

The data processing apparatus stated in any of the paragraphs (2) to (6) above, in which the second compression part includes a quantization part quantizing the differential value, and an encoding part encoding the differential value quantized by the quantization part.

(9)

The data processing apparatus stated in any of the paragraphs (2) to (8) above, in which the predictive value is an adjacent observation coefficient.

(10)

The data processing apparatus stated in any of the paragraphs (2) to (9) above, in which one of two modes is set for each of the observation coefficients, one of the two modes being a mode in which the differential value between the observation coefficient and the predictive value is calculated and compressed, the other mode being a mode in which the observation coefficient is compressed as the differential value.

(11)

The data processing apparatus stated in any of the paragraphs (2) to (9) above, in which the data compressed in the first compression part is image data of an image divided into blocks of a predetermined size each, and one of two modes is set for each of the blocks, one of the two modes being a mode in which the differential value between the observation coefficient and the predictive value is calculated and compressed, the other mode being a mode in which the observation coefficient is compressed as the differential value.

(12)

The data processing apparatus stated in the paragraph (11) above, in which the second compression part includes a quantization part quantizing the differential value, and an encoding part encoding the differential value quantized by the quantization part, and a quantization value in the quantization part is set for each of the blocks.

(13)

The data processing apparatus stated in the paragraph (12) above, in which a degree of difficulty in encoding the observation coefficient is calculated for each of the blocks, and the quantization value is set in accordance with the degree of difficulty in encoding.

(14)

The data processing apparatus stated in the paragraph (13) above, in which one of two modes is set for each of the blocks in accordance with the degree of difficulty in encoding, one of the two modes being a mode in which the differential value between the observation coefficient and the predictive value is calculated and compressed, the other mode being a mode in which the observation coefficient is compressed as the differential value.

(15)

The data processing apparatus stated in any of the paragraphs (1) to (9) above, in which the data compressed in the first compression part is image data, the data processing apparatus further including:

a band dividing part dividing the image data into a low-frequency component and a high-frequency component, and the second compression part compresses the high-frequency component of the image data divided by the band dividing part.

(16)

The data processing apparatus stated in the paragraph (15) above, in which the low-frequency component is compressed using a method other than the compressed sensing.

(17)

The data processing apparatus stated in the paragraph (15) or (16) above, in which the data compressed in the first compression part is image data of an image divided into blocks of a predetermined size each, the blocks are compressed to a fixed length each, and the second compression part compresses the high-frequency component to at least a bit length obtained by subtracting the bit length of the compressed low-frequency component from the bit length of the fixed length being set.

(18)

A data processing method including the steps of:

compressing data using compressed sensing; and encoding observation coefficients resulting from the compression.

(19)

A program for causing a computer to perform a process, including the steps of:

compressing data using compressed sensing; and encoding observation coefficients resulting from the compression.

REFERENCE SIGNS LIST

10 Data processing apparatus
20 Image sensor
21 Block dividing part
22 Random sampling part
23 Compression part
24 Recording part
25 Sampling matrix holding part
26 Sampling matrix calculating part
27 Decoding part
28 Sparse coefficient converting part
29 Image reconstructing part
30 Block synthesizing part
31 Sparse coefficient matrix holding part

The invention claimed is:

1. A data processing apparatus, comprising:
a first compression part configured to compress data based on compressed sensing; and
a second compression part configured to:
compress observation coefficients from the first compression part based on a compression method different from a method used in the first compression part;
calculate a differential value between the observation coefficients from the first compression part and a predictive value; and
compress the differential value.

2. The data processing apparatus according to claim 1, wherein
the first compression part is further configured to perform random sampling based on a sampling matrix, and
the second compression part is further configured to optimize the sampling matrix for the compression of the data.

3. The data processing apparatus according to claim 2, wherein the sampling matrix is designed to minimize the differential value.

4. The data processing apparatus according to claim 2, wherein
the data compressed in the first compression part is image data, and
the sampling matrix is designed in such a manner that the observation coefficients are arrayed in descending order of spatial correlations in an image.

5. The data processing apparatus according to claim 2, further comprising
a sampling matrix calculating part configured to generate the sampling matrix, wherein
the sampling matrix is generated in such a manner as to satisfy a restricted isometry property (RIP) condition and a requirement that row vectors of the sampling matrix and column vectors of a sparse coefficient matrix be incoherent, and
the sampling matrix is generated in such a manner that the row vectors of the generated sampling matrix are sorted to have the observation coefficients arranged in descending order of spatial correlations in an image.

6. The data processing apparatus according to claim 1, wherein the second compression part includes an encoding part configured to encode the observation coefficients.

7. The data processing apparatus according to claim 1, wherein the second compression part includes:
a quantization part configured to quantize the differential value; and
an encoding part configured to encode the differential value quantized by the quantization part.

8. The data processing apparatus according to claim 1, wherein the predictive value is an adjacent observation coefficient.

9. The data processing apparatus according to claim 1, wherein
one of a first mode or a second mode is set for each of the observation coefficients,
the first mode is a mode in which the differential value between the observation coefficients and the predictive value is calculated and compressed, and
the second mode is a mode in which the observation coefficients are compressed as the differential value.

10. The data processing apparatus according to claim 1, wherein
the data compressed in the first compression part is image data of an image divided into a plurality of blocks,
each block of the plurality of blocks has a determined size,
one of a first mode or a second mode is set for each block of the plurality of blocks,
the first mode is a mode in which the differential value between the observation coefficients and the predictive value is calculated and compressed, and
the second mode is a mode in which the observation coefficients are compressed as the differential value.

11. The data processing apparatus according to claim 10, wherein
the second compression part includes:
a quantization part configured to quantize the differential value;
a quantization value deciding part configured to set a quantization value for quantization in the quantization part for each block of the plurality of blocks; and
an encoding part configured to encode the differential value quantized by the quantization part.

12. The data processing apparatus according to claim 11, further comprising
variance value calculating part configured to calculate a degree of difficulty in encoding the observation coefficients is for each block of the plurality of blocks, wherein
the quantization value deciding part is further configured to set the quantization value based on the degree of difficulty in the encoding of the observation coefficients.

13. The data processing apparatus according to claim 12, wherein
one of the first mode or the second mode is set for each block of the plurality of blocks based on the degree of difficulty in the encoding of the observation coefficients.

14. The data processing apparatus according to claim 1, wherein
the data compressed in the first compression part is image data,
the data processing apparatus further comprising
a band dividing part configured to divide the image data into a low-frequency component and a high-frequency component, and
the second compression part is further configured to compress the high-frequency component of the image data divided by the band dividing part.

15. The data processing apparatus according to claim 14, wherein the low-frequency component is compressed based on a method other than the compressed sensing.

16. The data processing apparatus according to claim 15, wherein
the data compressed in the first compression part is image data of an image divided into a plurality of blocks;
each block of the plurality of blocks has a determined size,
each block of the plurality of blocks is compressed to a fixed length, and
the second compression part is further configured to compress the high-frequency component to at least a bit length obtained based on subtraction of a bit length of the compressed low-frequency component from a bit length of the fixed length.

17. A data processing method, comprising:
compressing data based on compressed sensing;
encoding observation coefficients resulting from the compression;

calculating a differential value between the observation coefficients resulting from the compression and a predictive value; and compressing the differential value.

18. A non-transitory computer-readable medium having stored thereon, computer-executable instructions which, when executed by a computer, cause the computer to execute operations, the operations comprising:
   compressing data using compressed sensing;
   encoding observation coefficients resulting from the compression;
   calculating a differential value between the observation coefficients resulting from the compression and a predictive value; and
   compressing the differential value.

19. A data processing apparatus, comprising:
   a first compression part configured to:
      perform random sampling based on a sampling matrix, wherein
         the sampling matrix is generated in such a manner as to satisfy a restricted isometry property (RIP) condition and a requirement that row vectors of the sampling matrix and column vectors of a sparse coefficient matrix be incoherent, and
         the sampling matrix is generated in such a manner that the row vectors of the generated sampling matrix are sorted to have observation coefficients arranged in descending order of spatial correlations in an image; and
      compress data based on compressed sensing; and
   a second compression part configured to:
      optimize the sampling matrix is for the compression of the data;
      compress the observation coefficients from the first compression part based on a compression method different from a method used in the first compression part;
      calculate a differential value between the observation coefficients from the first compression part and a predictive value; and
      compress the differential value.

\* \* \* \* \*